United States Patent
De Lega et al.

(10) Patent No.: US 7,289,224 B2
(45) Date of Patent: Oct. 30, 2007

(54) LOW COHERENCE GRAZING INCIDENCE INTERFEROMETRY FOR PROFILING AND TILT SENSING

(75) Inventors: Xavier Colonna De Lega, Middletown, CT (US); Peter J. De Groot, Middletown, CT (US); Michael Kuchel, Oberkochen (DE)

(73) Assignee: Zygo Corporation, Middlefield, CT (US)

( * ) Notice: Subject to any disclaimer, the term of this patent is extended or adjusted under 35 U.S.C. 154(b) by 324 days.

(21) Appl. No.: 10/941,631

(22) Filed: Sep. 15, 2004

(65) Prior Publication Data

US 2005/0057757 A1    Mar. 17, 2005

Related U.S. Application Data

(60) Provisional application No. 60/539,437, filed on Jan. 26, 2004, provisional application No. 60/502,907, filed on Sep. 15, 2003, provisional application No. 60/502,930, filed on Sep. 15, 2003, provisional application No. 60/502,932, filed on Sep. 15, 2003, provisional application No. 60/502,933, filed on Sep. 15, 2003.

(51) Int. Cl.
*G01B 9/02* (2006.01)
(52) U.S. Cl. ...................................... 356/497
(58) Field of Classification Search ................ 356/485, 356/489, 492, 495, 497, 504, 511–515, 521
See application file for complete search history.

(56) References Cited

U.S. PATENT DOCUMENTS 4,355,903 A    10/1982    Sandercock
4,498,771 A  * 2/1985    Makosch et al. ........... 356/495
4,576,479 A    3/1986    Downs
4,618,262 A    10/1986   Maydan et al.
4,626,103 A  * 12/1986   Feldman et al. ............ 356/508
4,660,980 A    4/1987    Takabayashi et al.

(Continued)

FOREIGN PATENT DOCUMENTS

| DE | 4108944 | 9/1992 |
|----|---------|--------|
| DE | 4309056 | 9/1994 |
| EP | 0 397 388 A2 | 11/1990 |
| EP | 0 549 166 A2 | 6/1993 |
| EP | 0 617 255 A1 | 9/1994 |

(Continued)

OTHER PUBLICATIONS

Berman et al., "Review of In Situ & In-line Detection for CMP Applications", *Semiconductor Fabtech—8th Edition*, pp. 267-274.

(Continued)

*Primary Examiner*—Samuel A. Turner
(74) *Attorney, Agent, or Firm*—Fish & Richardson P.C.

(57) ABSTRACT

An optical system includes a photolithography system, a low coherence interferometer, and a detector. The photolithography system is configured to illuminate a portion of an object with a light pattern and has a reference surface. The low coherence interferometer has a reference optical path and a measurement optical path. Light that passes along the reference optical path reflects at least once from the reference surface and light that passes along the measurement optical path reflects at least once from the object. The detector is configured to detect a low coherence interference signal including light that has passed along the reference optical path and light that has passed along the measurement optical path. The low coherence interference signal is indicative of a spatial relationship between the reference surface and the object.

46 Claims, 13 Drawing Sheets

U.S. PATENT DOCUMENTS

| | | | |
|---|---|---|---|
| 4,818,110 | A | 4/1989 | Davidson |
| 4,999,014 | A | 3/1991 | Gold et al. |
| 5,042,949 | A | 8/1991 | Greenberg et al. |
| 5,042,951 | A | 8/1991 | Gold et al. |
| 5,112,129 | A | 5/1992 | Davidson et al. |
| 5,129,724 | A | 7/1992 | Brophy et al. |
| 5,133,601 | A | 7/1992 | Cohen et al. |
| 5,135,307 | A | 8/1992 | de Groot et al. |
| 5,173,746 | A | 12/1992 | Brophy |
| 5,301,010 | A | 4/1994 | Jones et al. |
| 5,398,113 | A | 3/1995 | de Groot |
| 5,459,564 | A | 10/1995 | Chivers |
| 5,483,064 | A | 1/1996 | Frey et al. |
| 5,555,471 | A | 9/1996 | Xu et al. |
| 5,587,792 | A | 12/1996 | Nishizawa et al. |
| 5,589,938 | A | 12/1996 | Deck |
| 5,602,643 | A | 2/1997 | Barrett |
| 5,774,224 | A | 6/1998 | Kerstens |
| 5,900,633 | A | 5/1999 | Solomon et al. |
| 5,923,425 | A * | 7/1999 | Dewa et al. ............... 356/520 |
| 6,242,739 | B1 | 6/2001 | Cherkassky |
| 6,249,351 | B1 | 6/2001 | de Groot |
| H1972 | H | 7/2001 | Inoue ..................... 356/353 |
| 6,259,521 | B1 | 7/2001 | Miller et al. ............ 356/237.5 |
| 6,377,349 | B1 | 4/2002 | Fercher |
| 6,381,009 | B1 | 4/2002 | McGahan |
| 6,483,580 | B1 | 11/2002 | Xu et al. |
| 6,500,591 | B1 | 12/2002 | Adams ..................... 430/30 |
| 6,507,405 | B1 | 1/2003 | Grek et al. ............... 356/479 |
| 6,545,761 | B1 | 4/2003 | Aziz et al. |
| 6,545,763 | B1 | 4/2003 | Kim et al. |
| 6,590,656 | B2 | 7/2003 | Xu et al. |
| 6,597,460 | B2 | 7/2003 | Groot et al. |
| 6,611,330 | B2 | 8/2003 | Lee et al. |
| 6,633,389 | B1 | 10/2003 | Poris et al. |
| 6,633,831 | B2 | 10/2003 | Nikoonahad et al. |
| 6,636,322 | B1 | 10/2003 | Terashita |
| 6,694,284 | B1 | 2/2004 | Nikoonahad et al. |
| 6,721,094 | B1 | 4/2004 | Sinclair et al. |
| 6,856,384 | B1 | 2/2005 | Rovira |
| 6,878,916 | B2 * | 4/2005 | Schuster ................. 250/201.2 |
| 6,891,627 | B1 | 5/2005 | Levy et al. |
| 6,925,860 | B1 | 8/2005 | Poris et al. |
| 6,940,604 | B2 | 9/2005 | Jung et al. |
| 6,985,232 | B2 | 1/2006 | Sezginer |
| 6,999,180 | B1 | 2/2006 | Janik et al. |
| 7,088,451 | B2 | 8/2006 | Sezginer |
| 7,119,909 | B2 | 10/2006 | Unruh et al. |
| 2002/0135775 | A1 | 9/2002 | De Groot et al. |
| 2002/0196450 | A1 | 12/2002 | Olszak et al. |
| 2003/0112444 | A1 | 6/2003 | Yang et al. |
| 2004/0085544 | A1 | 5/2004 | de Groot et al. |
| 2004/0189999 | A1 | 9/2004 | de Groot et al. |
| 2004/0233442 | A1 | 11/2004 | Mieher et al. |
| 2004/0233444 | A1 | 11/2004 | Mieher et al. |
| 2005/0068540 | A1 | 3/2005 | de Groot et al. |
| 2005/0073692 | A1 | 4/2005 | de Groot et al. |
| 2005/0078318 | A1 | 4/2005 | de Groot |
| 2005/0078319 | A1 | 4/2005 | de Groot |
| 2005/0088663 | A1 | 4/2005 | de Groot et al. |
| 2005/0146727 | A1 | 7/2005 | Hill |
| 2005/0225769 | A1 | 10/2005 | Bankhead et al. |
| 2005/0237534 | A1 | 10/2005 | Deck |
| 2006/0012582 | A1 | 1/2006 | de Lega |

FOREIGN PATENT DOCUMENTS

| | | |
|---|---|---|
| EP | 0 929 094 A2 | 7/1999 |
| GB | 2385417 | 8/2003 |
| JP | 2002206914 A * | 7/2006 |
| WO | WO 97/44633 | 11/1997 |
| WO | WO 02/082008 | 10/2002 |
| WO | WO 03/062802 | 7/2003 |
| WO | WO 2004/023071 | 3/2004 |

OTHER PUBLICATIONS

Kujawinska, Malgorzata, "5 Spatial Phase Measurement Methods", *Interferogram Analysis: Digital Fringe Pattern Measurement Techniques*, pp. 141-193.

Ngoi et al., "Phase-shifting interferometry immune to vibration", *Applied Optics*, vol. 40:19, pp. 3211-3214 (2001).

International Search Report dated Aug. 16, 2005.

C. Akcay et al., "Spectral shaping to improve the point spread function in optical coherence tomography", *Optics Letters*, vol. 28 No. 20, pp. 1921-1923 (Oct. 15, 2003).

R.M.A. Azzam et al., "Reflection and Transmission of Polarized Light by Stratified Planar Structures", *Ellipsometry and Polarized Light*, Elsevier Science B.V. ISBN 0 444 87016 4 (Paperback) pp. 267-363 (1987).

R.M.A. Azzam et al, "Ellipsometric function of a film-substrate system: Applications to the design of reflection-type optical devices and to ellipsometry", *Journal of the Optical Society of America*, vol. 5, No. 3, pp. 252-260.

M. Bashkansky et al., "Signal Processing for Improving Field Cross-correlation Function in Optical Coherence Tomography", *Supplement to Optics & Photonics News*, 9(5) (May 1998).

A. Bosseboeuf et al., "Application of microscopic interferometry techniques in the MEMS field", *Proceedings of SPIE*, vol. 5145, pp. 1-16 (2003).

M. Davidson et al., "An Application of Interference Microscopy to Integrated Circuit Inspection and metrology", *Proceedings SPIE*, vol. 775, pp. 233-247 (1987).

T. Dresel et al., "Three-dimensional sensing of rough surfaces by coherence radar", *Applied Optics*, vol. 31, No. 7, pp. 919-925 (Mar. 1, 1992).

J.E. Greivenkamp, "Generalized data reduction for heterodyne interferometry", *Optical Engineering.*, vol. 23 No. 4, pp. 350-352 (Jul./Aug. 1984).

P de Groot et al., "Signal modeling for low coherence height-scanning interference microscopy", *Applied Optics*, vol. 43 No. 25, pp. 4821-4830 (Sep. 1, 2004).

P. de Groot, "Derivation of algorithms for phase-shifting interferometry using the concept of a data-sampling window", *Appl. Opt.*, 34(22), p. 4723-4730 (1995).

P. de Groot et al., "Signal modeling for modern interference microscopes", *SPIE Proceedings*, 5457-4 (2004).

Peter de Groot et al., "Determination of fringe order in white-light interference microscopy", *Appl. Opt.*, 41(22) pp. 4571-4578 (2002).

Feke, Gilbert D. et al., "Interferometric back focal plane microellipsometry", *Applied Optics*, vol. 37, No. 10, pp. 1796-1802 (Apr. 1, 1998).

P.A. Flournoy et al., "White-light interferometric thickness gauge", *Appl. Opt.*, 11(9), pp. 1907-1915 (1972).

G. Hausler et al., "Coherence Radar and Spectral Radar—New Tools for Dermatological Diagnosis", *Journal of Biomedical Optics*, vol. 3, No. 1, pp. 21-31 (Jan. 1998).

R.D. Holmes et al., "Scanning microellipsometry for extraction of true topograpy", *Electronics Letters*, vol. 31, No. 5, pp. 358-359 (Mar. 2, 1995).

Kim, Seung-Woo et al., "Thickness-profile measurement of transparent thin-film layers by white-light scanning interferometry", *Applied Optics*, vol. 38, No. 28, pp. 5968-5973 (Oct. 1, 1999).

Kino, Gordon S. et al., "Mirau correlation microscope", *Applied Optics*, vol. 29, No. 26, pp. 3775-3783 (Sep. 10, 1990).

Kieran G. Larkin, "Efficient nonlinear algorithm for envelope detection in white light interferometry", *Journal of the Optical Society of America A*, vol. 13, No. 4, pp. 832-843 (1996).

Lee et al., "Profilometry with a coherence scanning microscope", *Appl. Opt.*, 29(26), pp. 3784-3788 (1990).

I. Lee-Bennett, "Advances in non-contacting surface metrology", *OF&T Workshop*, papter OTuC1 (2004).

K. Leonhardt et al., "Micro-Ellipso-Height-Profilometry", *Optics Communications*, vol. 80, No. 3, 4, pp. 205-209 (Jan. 1, 1991).

Y. Liu et al., "Common path interferometric microellipsometry", *SPIE*, vol. 2782, pp. 635-645 (1996).

Lyakin et al., "The interferometric system with resolution better than coherence length for determination of geometrical thickness and refractive index of a layer object", *Proceedings of the SPIE—The International Society for Optical Engineering SPIE-INT. Soc. Opt. Eng USA*, vol. 4956, pp. 163-169 (Jul. 2003).

C.J. Morgan, "Least-Squares estimation in phase-measurement interferometry", *Optics Letters*, 7(8), pp. 368-370 (1982).

A.V. Oppenheim et al., "10.3: The time-dependent Fourier Transform", *Discrete-Time Signal Processing*, 2nd Edition, pp. 714-722 (Prentice Hall, New Jersey, 1999).

M.C. Park et al., "Direct quadratic polynomial fitting for fringe peak detection of white light scanning interferograms", *Optical Engineering*, vol. 39, No. 4, pp. 952-959 (2000).

S. Pettigrand et al., "Mesures 3D de topographies et de vibrations a l'echelle (sub)micrometrique par microscopie optique interferometrique", *Proc. Club CMOI, Methodes et Techniques Optiques pour l'Industrie*, (2002).

M. Pluta, "Advanced light microscopy", vol. 3, PWN—Polish Scientific Publishers (Elsevier, Amsterdam), pp. 265-271 (1993).

W.H. Press et al., "Linear Correlation", *Numerical Recipes in C*, Cambridge University Press, 2nd Edition, pp. 636-639 (1992).

Rosencwaig, Allan et al., "Beam profile reflectometry: A new technique for dielectric film measurements", *Applied Physics Letters*, vol. 60, No. 11, pp. 1301-1303 (Mar. 16, 1992).

P. Sandoz et al., "Optical implementation of frequency domain analysis for white light interferometry", *Proceedings SPIE*, vol. 2545, pp. 221-228 (Jun. 1995).

P. Sandoz et al., "High-resolution profilometry by using phase calculation algorithms for spectroscopic analysis of white-light interferograms", *Journal of Modern Optics*, vol. 43, No. 4, pp. 701-708 (1996).

Sandoz, Patrick "Wavelet transform as a processing tool in white-light interferometry", *Optics Letters*, vol. 22, No. 14, pp. 1065-1067 (Jul. 15, 1997).

P. Sandoz et al., "Processing of white light correlograms: simultaneous phase and envelope measurements by wavelet transformation", *SPIE*, vol. 3098, pp. 73-82 (1997).

U. Schnell et al., "Dispersive white-light interferometry for absolute distance measurement with dielectric multilayer systems on the target", *Optics Letters*, vol. 21, No. 7, pp. 528-530 (Apr. 1996).

J. Schwider et al., "Dispersive interferometric profilometer", *Optics Letters*, vol. 19, No. 13, pp. 995-997 (Jul. 1994).

C.W. See et al., "Scanning optical microellipsometer for pure surface profiling", *Applied Optics*, vol. 35, No. 34, pp. 6663-6668 (Dec. 1, 1996).

Shatalin, S.V. et al., "Reflection conoscopy and micro-ellipsometry of isotropic thin film structures", *Journal of Microscopy*, vol. 179, Part 3, pp. 241-252 (Sep. 1995).

M. Totzeck, "Numerical simulation of high-NA quantitative polarization microscopy and corresponding near-fields", *Optik*, vol. 112, No. 9, pp. 399-406 (2001).

R. Tripathi et al., "Spectral shaping for non-Gaussian source spectra in optical coherence tomography", *Optics Letters*, vol. 27, No. 6, pp. 406-408 (Mar. 15, 2002).

D. Willenborg et al, "A novel micro-spot dielectric film thickness measurement system", *SPIE*, vol. 1594, pp. 322-333 (1991).

\* cited by examiner

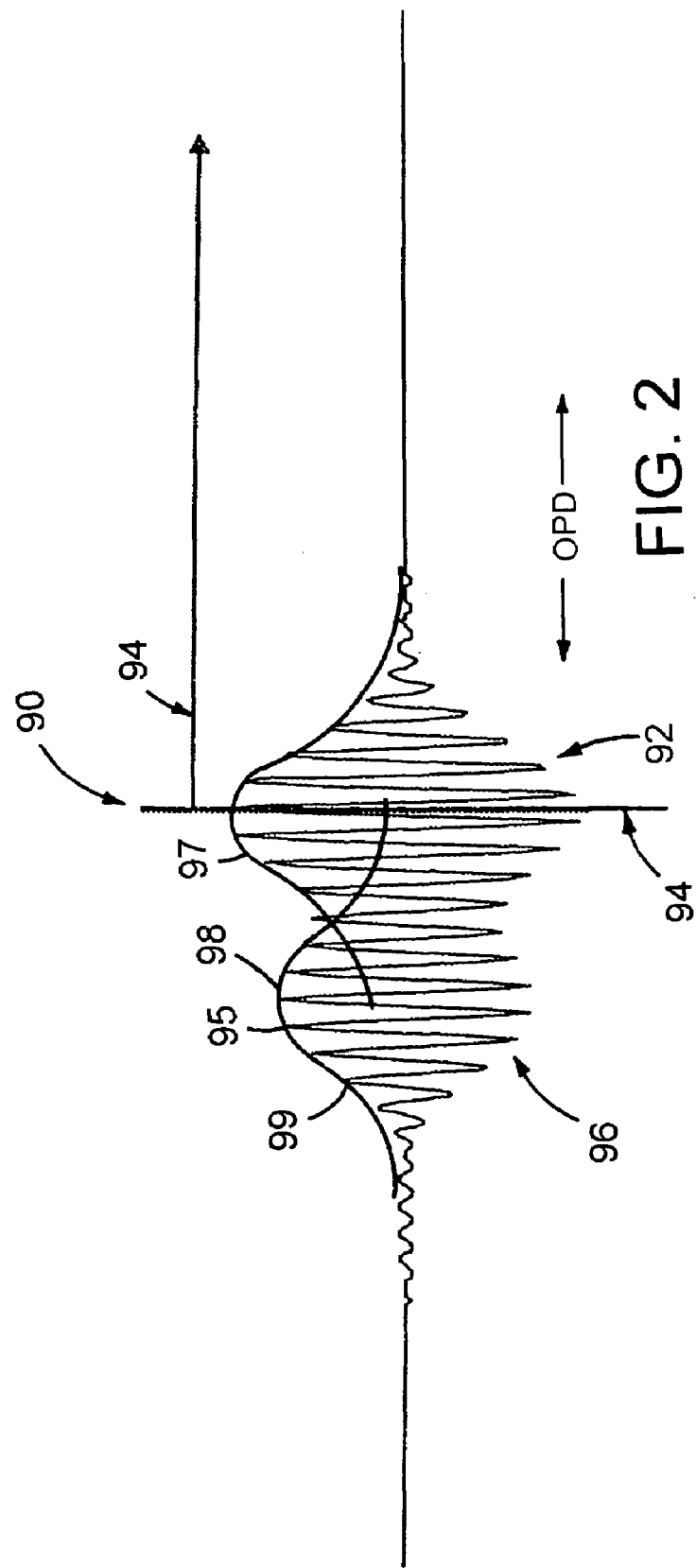

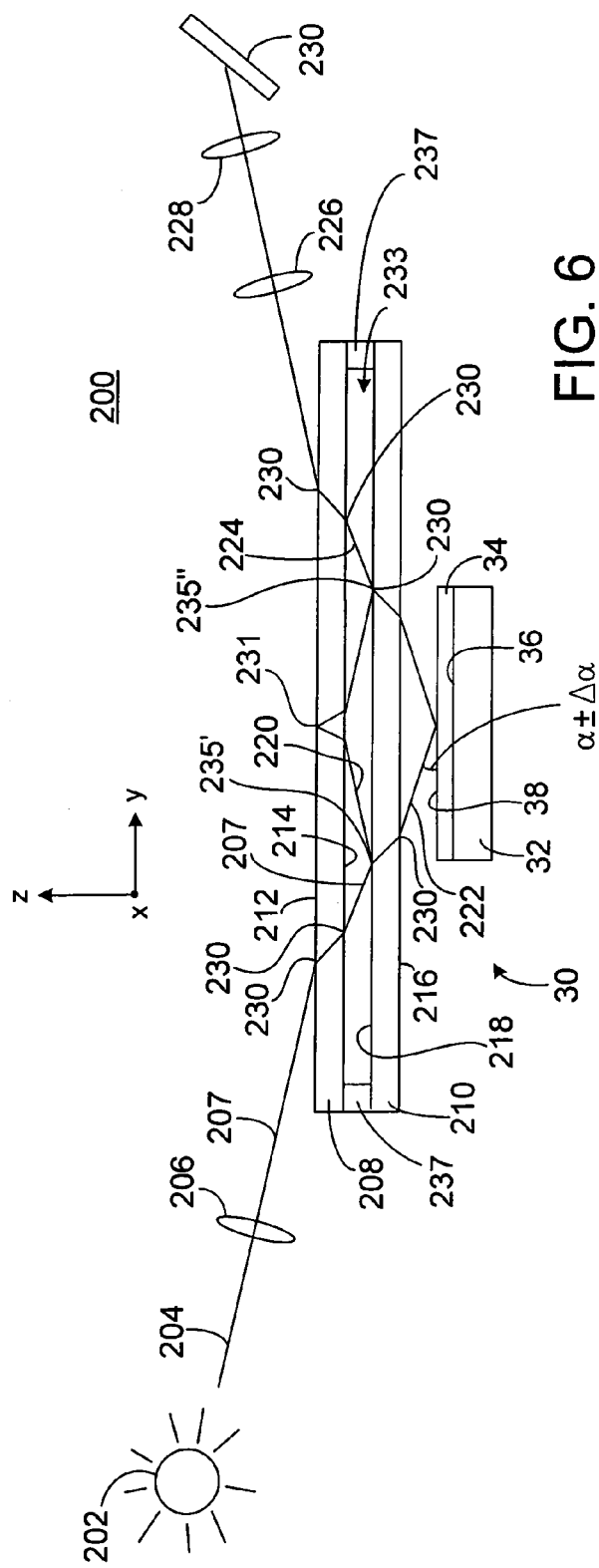
FIG. 6
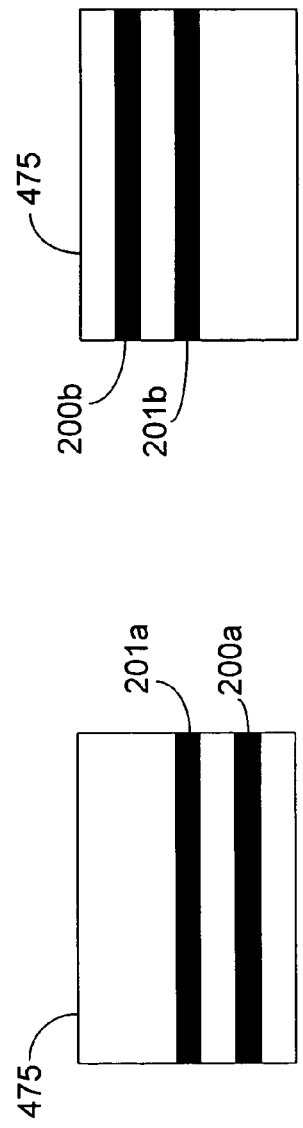
FIG. 7A
FIG. 7B

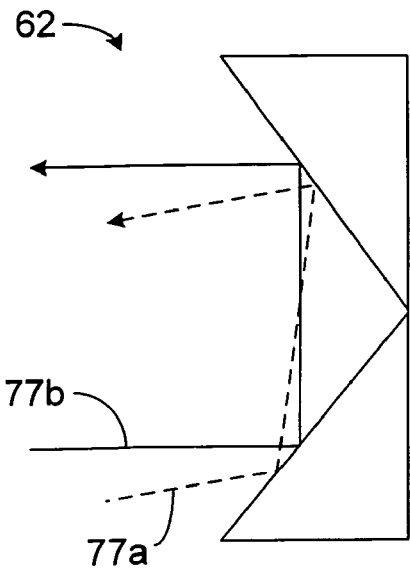
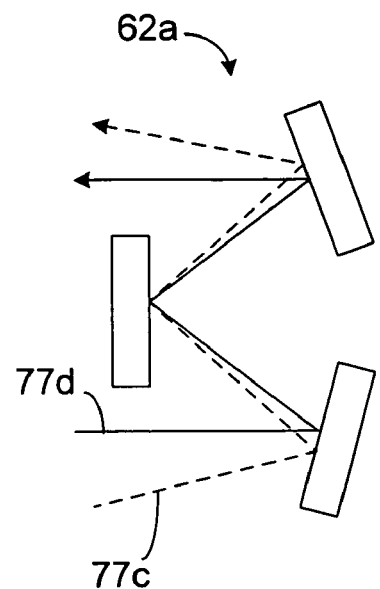
FIG. 11A  FIG. 11B
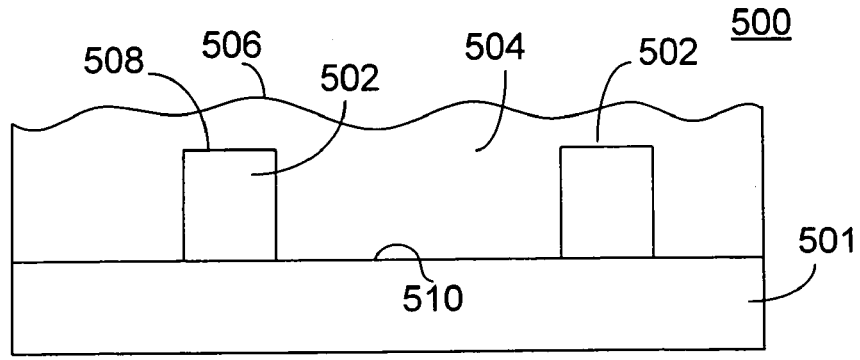
FIG. 12A
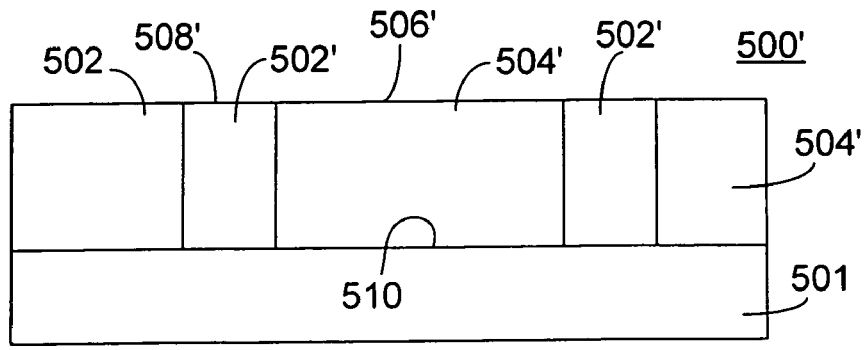
FIG. 12B

US 7,289,224 B2

LOW COHERENCE GRAZING INCIDENCE INTERFEROMETRY FOR PROFILING AND TILT SENSING

RELATED APPLICATIONS

The present application claims the benefit of U.S. provisional application nos. 60/502,932, filed Sep. 15, 2003, for High Speed Scanning Interferometer for Surface Profiling and for Focus and Tilt Sensing, 60/502,933, filed Sep. 15, 2003, for Grazing Incidence Interferometer for Profiling Surfaces Which May Have a Thin Film Coating, 60/502,907, filed Sep. 15, 2003, for Triangulation Sensor for Profiling Surfaces Through a Thin Film Coating, 60/502,930, filed Sep. 15, 2003, for Rapid Measurement of Surface Topographies in the Presence of Thin Films, and 60/539,437, filed Jan. 26, 2004, for Surface Profiling Using An Interference Pattern Matching Template, each of which applications in incorporated herein by reference.

FIELD OF THE INVENTION

The invention relates to interferometric analysis of objects, such as to the interferometric analysis of objects including a substrate having one or more at least partially transparent layers.

BACKGROUND

Interferometric techniques are commonly used to measure the profile of a surface of an object. To do so, an interferometer combines a measurement wavefront reflected from the surface of interest with a reference wavefront reflected from a reference surface to produce an interferogram. Fringes in the interferogram are indicative of spatial variations between the surface of interest and the reference surface.

A scanning interferometer scans the optical path length difference (OPD) between the reference and measurement legs of the interferometer over a range of comparable to, or larger than, the coherence length of the interfering wavefronts, to produce a scanning interferometry signal for each camera pixel used to measure the interferogram. A limited coherence length can be produced, for example, by using a white-light source and/or a spatially extended source. An exemplary technique is scanning white light interferometry (SWLI), which includes use of a broadband source. A typical scanning whit light interferometry (SWLI) signal is a few fringes localized near the zero optical path difference (OPD) position. The signal is typically characterized by a sinusoidal carrier modulation (the "fringes") with bell-shaped fringe-contrast envelope. The conventional idea underlying SWLI metrology is to make use of the localization of the fringes to measure surface profiles.

Techniques for processing low-coherence interferometry data include two principle trends. The first approach is to locate the peak or center of the envelope, assuming that this position corresponds to the zero optical path difference (OPD) of a two-beam interferometer for which one beam reflects from the object surface. The second approach is to transform the signal into the frequency domain and calculate the rate of change of phase with wavelength, assuming that an essentially linear slope is directly proportional to object position. See, for example, U.S. Pat. No. 5,398,113 to Peter de Groot. This latter approach is referred to as Frequency Domain Analysis (FDA).

SUMMARY

Systems and methods described herein can be used to determine spatial properties of objects having more than one interface.

In one aspect, the invention relates to an optical system comprising a photolithography system configured to illuminate a portion of an object with a light pattern, the photolithography system comprising a reference surface, a low coherence interferometer having a reference optical path and a measurement optical path. Light that passes along the reference optical path reflecting at least once from the reference surface and light that passes along the measurement optical path reflecting at least once from the object, and a detector configured to detect a low coherence interference signal comprising light that has passed along the reference optical path and light that has passed along the measurement optical path. The low coherence interference signal is indicative of a spatial relationship between the reference surface and the object.

In some embodiments, the photolithography system includes an illumination optic having an illumination optic surface. Light of the light pattern travels along an optical path that includes the illumination optic surface. The illumination optic surface and the reference surface are at least partially coextensive. The light that passes along the measurement optical path may reflect at least once from the portion of the object to be illuminated by the photolithography system.

The light of the low coherence interference signal that has passed along the reference optical path and the light of the low coherence interference signal that has passed along the measurement optical path may have a range of optical path length differences. The range may be at least 20%, at least 50%, at least 75%, or more of a coherence length of the low coherence interferometer. The range may be at least as great as the coherence length of the low coherence interferometer.

In some embodiments, the detector comprises a plurality of detector elements each configured to detect a respective low coherence interference signal. Each low coherence interference signal may comprise light that has passed along a respective different portion of the reference optical path and light that has passed along a respective different portion of the measurement optical path. Each low coherence interference signal may be indicative of a spatial relationship between a different point of the object and the reference surface.

The optical system may be configured to determine the spatial relationship between each of the different points of the object and the reference surface based on at least a respective one of the low coherence interference signals. The optical system may include a translation stage for manipulating a relative position and orientation between the object and the photolithography system. The processor may be further configured to modify a relative position of the object and the photolithography system based on the spatial relationships.

Another aspect of the invention relates to a method comprising positioning an object generally along an optical path of a photolithography system, reflecting a first portion of light from a light source from a reference surface of the photolithography system, reflecting a second portion of light from the light source from the object, and forming a low coherence interference signal comprising light reflected from the reference surface and light reflected from the object, the low coherence interference signal indicative of a spatial relationship between the object and the imaging system.

In some embodiments, the method includes reflecting a respective first portion of light from the light source from each of a plurality of locations of the reference surface of the photolithography system, reflecting a respective second portion of light from the light source from each of a plurality of locations of the object, e.g., at a grazing angle of incidence, and forming plurality of low coherence interference signals. Each low coherence interference signal comprises light reflected from a respective one of the different locations of the reference surface and light reflected from a respective one of the different locations of the object. Each low coherence interference signal may be indicative of a spatial relationship between at least one of the different locations of the object and the photolithography system.

In some embodiments, first and second portions of light can be reflected after positioning the object.

The method can further comprise changing a relative position of the object and the reference surface based on the spatial relationship. The reference surface can be a surface of an optical of the photolithography system. The photolithography system can be used to project an ultraviolet light image onto the object. Light that forms the ultraviolet image passes along an optical path including the surface of the optic.

The object can include a substrate and an overlying thin film having an outer surface and the forming can comprise combining light reflected from the reference surface and light reflected from the outer surface of the thin film. The spatial relationship may be between the outer surface of the thin film and the photolithography system.

The light of the second portion of light from the light may be substantially attenuated, e.g., absorbed, by the thin film.

The thin film can include photoresist, with the light of the second portion of light from the light source having an energy insufficient to expose the photoresist.

The object can include a substrate and a thin film having an outer surface. The with the forming and the forming comprises combining light reflected from the reference surface and light reflected from the substrate, and the spatial relationship is between the substrate and the imaging system.

The object can be illuminated at Brewster's angle, which may enhance spatial information related to the substrate as opposed to the outer surface.

Another aspect of the invention relates to a system for determining a spatial property of an object. The system can include a light source, an optical system configured to, illuminate the object at a grazing angle of incidence with a first portion of light from the light source, at least some of the first portion of light reflecting from the object, combine, over a range of optical path differences, light reflected from the object and a second portion of light derived from the same light source, and a detector configured to detect the light combined over the range of optical path differences as a plurality of interference fringes each having a peak amplitude, the range of optical path differences being sufficient to modulate the peak amplitudes of the interference fringes.

The range of optical path differences may be at least as great as a coherence length of the optical system.

Another aspect of the invention relates to a method including illuminating an object a grazing angle of incidence with light from a light source. At least some of the illuminating light reflects from the object. Light reflected from the object and a second portion of light from the light source are combining over a range of optical path differences. The light combined over a range of optical path differences as a plurality of interference fringes each having a peak amplitude. The range of optical path differences is sufficient to modulate the peak amplitudes of the interference fringes.

Another aspect of the invention relates to a including projecting a first pattern of light on an object comprising a substrate and an overlying thin film, imaging light of the first projected pattern that is diffusely scattered by the substrate, and determining a spatial property of the object based on the diffusely scattered light.

The overlying thin film may be photoresist and determining a spatial property may include determining a position of a portion of the object relative to a photolithography system. The portion of the object may be an interface between the substrate and the overlying photoresist.

The first pattern of light may include comprises first and second portions of light from the same light source and the first pattern of light may be an interference pattern. The interference pattern can include a plurality of fringes modulated by an envelope and the determining a spatial property of the object comprises determining a position of a portion of the envelope relative to the fringes.

The object can be repositioned based on the position of the portion of the envelope.

Some embodiments include projecting a reference pattern of light on a reference surface, detecting light of the reference pattern projected onto the reference surface, and the determining a spatial property of the object comprises determining a relative spatial property of the object and the reference surface based on the detected light of the reference pattern. The object can be moved based on the relative spatial property.

Some embodiments further include modifying a property of the light source to project a second interference pattern comprising a plurality of fringes having a substantially similar amplitude onto the object, imaging light of the second interference pattern that is diffusely scattered by the substrate, and determining a second spatial property of the object based on the diffusely scattered light from the second interference pattern. The second spatial property may be a topography of a portion of the object. The second spatial property may be indicative of an absolute position of the object. At least the modifying can be performed before projecting the first pattern of light.

Methods and systems described herein can be used to determine a spatial property of an object comprising a substrate comprising an overlying layer of photoresist having an outer surface. The spatial property can be a of the outer surface. The methods and systems can change a relative position between a photolithography system and the object based on the spatial property.

Methods and systems described herein can be used to determine a spatial property of a portion of a liquid crystal display.

Methods and systems described herein can be used in scribing objects, e.g., by a laser. A spatial property of a scribed line formed on an object by the scribing is determined. Further scribing of the object or another object is performed. A parameter, e.g., a laser power, object scan rate, or laser focus size is selected based on the spatial property of the scribed line.

Methods and systems described herein can be used to determine a spatial property of a structure formed during solder bump manufacturing. The spatial property can be a spatial property of a portion of the object non-wettable by solder.

Another aspect of the invention relates to an apparatus including a photolithography system configured to illuminate a portion of an object with an first light pattern. The photolithography system includes a reference surface. The object includes a substrate and an overlying thin film. The apparatus also includes a positioner to change a relative position between the photolithography system and the object, a light projector configured to project a second light pattern on the overlying thin film of the object, an optical system to image light of the second light pattern that is diffusely scattered by the substrate, and a processor configured to determine a spatial property of the object based on the diffusely scattered light and change the relative position between the photolithography system and the object.

Another aspect of the invention relates to an optical system including a detector comprising a plurality of elements arranged in at least two dimensions, and an optical system configured to illuminate a plurality of spaced-apart points of an object with light from a light source, form a respective interference pattern corresponding to each illuminated point, each interference pattern extending along a first dimension of the detector, the interference patterns for different points being spaced apart along a second dimension of the detector.

Another aspect of the invention relates to an optical system including a light source, an array of detector elements extending in at least one dimension, an interferometer configured to illuminate, with a first portion of light from the light source, a point of an object, and focus light reflected from the illuminated point as an elongated focus extending along the first dimension of the array, and focus a second portion of light form the source as a second focus extending along the first dimension of the array, the second focus and the elongated focus being at least partially coincident along the first dimension of the array, an optical path difference (OPD) between the light reflected from the illuminated point and the second portion of light from the source varying along the first dimension of the array by an amount greater than a coherence length of the light reflected from the illuminated point.

Another aspect of the invention relates to an interferometry method, comprising illuminating a plurality of spaced-apart points of an object with a first portion of light from a light source, at least some of the first portion of light reflecting from each of the spaced-apart points, and forming a plurality of interference patterns on a detector having a plurality of detector elements arranged in at least two dimensions, wherein each interference pattern comprises light reflected from a respective spaced-apart point of the object, each interference pattern extends along a first dimension of the detector, and different interference patterns are spaced apart along a second dimension of the detector.

Unless otherwise defined, all technical and scientific terms used herein have the same meaning as commonly understood by one of ordinary skill in the art to which this invention belongs.

Other features, objects, and advantages of the invention will be apparent from the following detailed description.

BRIEF DESCRIPTION OF THE DRAWINGS

FIG. 1b is a top view of the object of FIG. 1a.

FIG. 2 is a low coherence interference signal including first and second interference patterns with amplitudes that vary according to a respective envelope function.

FIG. 5b illustrates displacement vectors showing rotation between light passing along the measurement optical path and reference optical path resulting from the measurement object tilt referred to in FIG. 5a.

FIG. 6 is a grazing incidence interferometry system.

FIGS. 7a and 7b show detector images for a triangulation mode of a grazing incidence interferometry system.

FIG. 8b is a magnified view of a portion of the system of FIG. 8a.

FIG. 10 illustrates correspondence between illuminated points of a measurement object and respective, elongated images detected for the illuminated points using the system of FIG. 9a.

FIGS. 11a and 11b are exemplary components of a reference leg of the interferometry system of FIG. 9a.

FIGS. 12a and 12b are exemplary structures having copper interconnects. FIGS. 12a and 12b showing the structure before and after planarization, respectively.

FIG. 13a showing the structure before addition of solder. FIG. 13b showing the structure after addition of solder but prior to flowing the solder.

DETAILED DESCRIPTION

Figure 1A:
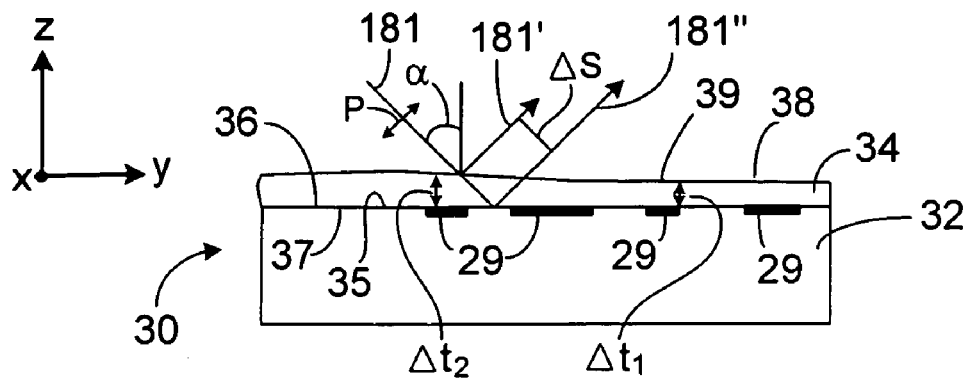
FIG. 1a is a cross-section of a measurement object including a substrate and an overlying layer, e.g., a thin film.

Embodiments of methods and systems described herein relate to the use of interferometry to measure a spatial property, e.g., a surface topography, a position, an orientation, and/or other characteristics, of objects having more than one interface, such as thin film structures, discrete structures of dissimilar materials, or discrete structures that may be underresolved by the optical resolution of an interference microscope. Examples of interfaces include interfaces formed at the outer surface of an object or interfaces formed internally between dissimilar materials. Spatial properties of objects having more than one interface are relevant to a variety of fields including flat panel displays, microelectronics, photolithography, thin films characterization, and dissimilar materials analysis.

When an object with multiple interfaces is analyzed by interferometry, each interface can produce an interference pattern. If the interfaces are closely spaced, the interference patterns may overlap, distorting one another. The distortion can lead to erroneous determinations of spatial properties of the object. As an example, consider efforts to position a semiconductor wafer with overlying photoresist at a focus position with respect to a photolithography system. The quality of photolithography is related to how precisely the wafer and photolithography system can be positioned with respect to one another. However, the outer surface of the photoresist and the interface between the photoresist and the wafer generate resulting interference patterns, which makes determining the exact position and orientation of the photoresist outer surface or the wafer difficult. Consequently, the quality of photolithography may suffer.

Systems and methods described herein can determine a spatial property of a selected interface of an object even in the presence of other adjacent or closely spaced interfaces. Some embodiments include illuminating the object with light at a grazing angle of incidence α and detecting a low coherence interference signal including light reflected from the object. Angle α, taken with respect to a dimension extending normal to the object, may be at least 60°, at least 70°, e.g., at least 80°.

Grazing incidence illumination can increase the reflectivity of the outer surface relative to other interfaces of the illuminated object. The reflectivity increase enhances interference patterns from the outer interface as opposed to internal interfaces of the object. Hence, interference signals obtained with grazing incidence can be more sensitive than normal angle of incidence illumination to spatial properties of the outer surfaces of objects. Embodiments for enhancing interference patterns from the outer surface of a layer also (or alternatively) include selecting wavelengths of illuminating light that are attenuated, e.g., absorbed, by the layer. Because the layer absorbs the light, interference patterns from underlying interfaces are relatively attenuated.

Also disclosed are embodiments in which grazing incidence techniques are combined with low-coherence interferometry. As described further below, low-coherence interferometry data can be processed to provide spatial information about one or more interfaces of a complex sample, such as a thin film structure. Such low coherence interferometry data can be obtained by using a spectrally broadband light and/or a spatially extended source. Accordingly, some embodiments for enhancing the interference pattern from the outer surface of an object include illuminating the object at grazing incidence with broadband light, e.g., light having a full width half maximum (FWHM) of at least 6 nm, at least 12.25 nm, at least 25 nm, at least 50 nm, at least 100 nm, or at least 150 nm. When grazing incidence illumination is combined with broadband light, interference patterns obtained from the outer surface of an object may be enhanced relative to interference patterns obtained from internal interfaces of the object.

Enhancing the interference patterns resulting from an outer surface of a layer can benefit a number of applications, e.g., the photolithography positioning mentioned above. For example, grazing incidence methods and systems described herein can determine the thickness of a photoresist layer overlying a substrate with a relative accuracy of about 1% or better for thin films, e.g., films about 400 nm thick or thicker. In a particular example, a thickness of a 450 nm thick layer of XF1 157 nm UV photoresist overlying a silicon film having a thickness of 450 nm was determined with an error of ±4.9 nm using light having a nominal wavelength of 600 nm, a FWHM of 200 nm, an angle of incidence α of 80° and a Δα of +/−3°.

Embodiments of grazing incidence illumination are not limited to enhancing interference patterns resulting from an outer surface of an object. Interference patterns from internal interfaces can also be enhanced. For example, an object can be illuminated at Brewster's angle with light polarized in a plane defined by the angle of incidence. In this case, Brewster's angle is determined by the optical properties, e.g., refractive index, of the overlying layer, and by the wavelengths of the illuminating light. At Brewster's angle, interference patterns from underlying interfaces are enhanced relative to interference patterns from the outer surface.

Grazing angle of incidence illumination provides other advantages compared to normal angle of incidence illumination. For example, an illumination beam having a grazing angle of incidence can be used to illuminate an object in close proximity with other objects or systems. For example, grazing incidence interferometers described herein can introduce an illumination beam between an the imaging optics of a photolithography system and an object with photoresist to be imaged. Hence, benefits of grazing incidence with respect to thin film analysis can be realized in situ for complex, crowded working environments. All of the interferometers and optical systems discussed herein may be used to determine a spatial property of an object, e.g., a subset of the object to be imaged, with respect to a photolithography apparatus and, with feedback, modify the relative position and/or orientation of the object and photolithography apparatus. Additionally, each interferometer and optical system may include a reference surface that is itself a surface of a photolithography apparatus, e.g., a surface of an optic of the photolithography apparatus.

Accordingly, grazing incidence illumination allows enhancing interference patterns from a selected interface (whether an outer surface or an internal interface) to increase the accuracy of spatial properties determined based on the interference patterns. Methods and systems for determining one or more spatial properties of objects are described below. We begin with a general description of an object having more than one interface and describe interference patterns that might be obtained from such an object using, e.g., a low coherence grazing incidence interferometer. Then, embodiments of optical systems are discussed.

Referring to FIG. 1a, an object 30 includes a substrate 32 and a layer 34. Object 30 includes a plurality of interfaces as occur between materials of different refractive index. For example, an object-surroundings interface 38 is defined where an outer surface 39 of layer 34 contacts the environment surrounding object 30, e.g., liquid, air, other gas, or vacuum. A substrate-layer interface 36 is defined between a surface 35 of substrate 32 and a bottom surface 37 of layer 34. Surface 35 of the substrate may include a plurality of patterned features 29. Some of these features have the same height as adjacent portions of the substrate but a different refractive index. Other features may extend upward or downward relative to adjacent portions of the substrate. Accordingly, interface 36 (and, of course, interface 38) may exhibit a complex, varying topography.

Referring to FIG. 2, an interference signal 90 is exemplary of a low coherence interference signal that may be obtained from objects having closely spaced interfaces using systems and methods described herein. Interference signal 90 includes first and second overlapping interference patterns 92,96 respectively resulting from outer surface 39 and interface 36. The X-axis of interference signal 90 corresponds to an optical path difference (OPD) between light reflected from the object and reference light. An interferometer can vary the OPD by scanning, e.g., by moving an optic and/or the object to vary the optical path traveled by the light reflecting from the object or the reference light. An interferometer may, alternatively or in combination, vary the OPD by detecting a spatial distribution of light reflected from the object and the reference light with the OPD varying as a function of spatial position.

Interference patterns 92,96 are modulated as a function of OPD by respective coherence envelopes 97,95, which have similar shapes and widths. In the absence of the low coherence envelope, the fringes 98,99 typically have similar amplitudes. The width of an interference pattern envelope corresponds generally to the coherence length of the detected light. Among the factors that determine the coherence length are temporal coherence phenomena related to, e.g., the spectral bandwidth of the source, and spatial coherence phenomena related to, e.g., the range of angle of incidence of light illuminating the object.

Typically, the coherence length decreases as: (a) the spectral bandwidth of the source increases and/or (b) the range of angles of incidence increases. Depending upon the configuration of an interferometer used to acquire the data, one or the other of these coherence phenomena may dominate or they may both contribute substantially to the overall coherence length. In some embodiments, grazing angle of incidence interferometers described herein illuminate objects with broadband light having a range $\Delta\alpha$ of angles of incidence. The light source may be extended. The range $\Delta\alpha$ can be $\pm 20°$ or less, $\pm 10°$ or less, $\pm 5°$ or less, or $\pm 3°$ or less. In some embodiments, the illumination numerical aperture is 0.2 or less, 0.1 or less, 0.07 or less, 0.06 or less, e.g., 0.05 or less. Because of the grazing angle of incidence, spatial coherence phenomena contribute to the observed interference signals at lower ranges of angles of incidence than that for normal incidence. This is because the spatial coherence phenomena are related to changes in path length of oblique rays, which scale inversely with the cosine of the angle of incidence $\alpha$. Description of interference signals including contributions from spatial coherence phenomena are described in U.S. patent application Ser. No. 10/659,060, titled Interferometry Method for Ellipsometry, Reflectometry, and Scatterometry Measurements, Including Characterization of Thin Films, which is incorporated herein by reference. In some embodiments, both spatial and temporal coherence phenomena contribute to the coherence length, which may desirably attenuate interference patterns resulting from internal interfaces.

The coherence length of an interferometer can be determined by obtaining an interference signal from an object having a single reflecting surface, e.g., not a thin film structure. The coherence length corresponds to the full width half maximum of the envelope modulating the observed interference pattern. As can be seen from FIG. 2, interference signal 90 results from detecting light having a range of optical path differences that varies by more than the width of the coherence envelopes and, therefore, by more than the coherence length of the detected light. In general, a low coherence interference signal includes interference fringes that are amplitude modulated by the coherence envelope of the detected light. For example, the interference pattern may be obtained over an OPD for which the amplitude of the observed interference fringes differs by at least 20%, at least 30% or at least 50% relative to one another. For example, fringe 98 has a peak amplitude that is about 50% less than a peak amplitude of a fringe 99. In some embodiments, the low coherence interference signal is detected over a range of OPD's that is comparable to or greater than the coherence length. For example, the range of OPD's may be at least 2 times greater at least 3 times greater than the coherence length. In some embodiments, the coherence length of the detected light is on the order of the height variations of features of the object, e.g., on the order of couple of microns or less.

Interference signals obtained using methods and systems described herein can be processed in a number of ways to determine a spatial property of the object. In some embodiments, processing the interference signal includes transformation of the signal to an inverse dimension. Such transformation can include Fourier transformation of a signal. The transformation may be performed during Frequency Domain Analysis (FDA) or an extension thereof. Exemplary FDA methods are described in U.S. Pat. No. 5,398,113 entitled "METHOD AND APPARATUS FOR SURFACE TOPOGRAPHY MEASUREMENTS BY SPATIAL-FREQUENCY ANALYSIS OF INTERFEROGRAMS" and U.S. patent application Ser. No. 10/795,808 filed Mar. 8, 2003 and entitled "PROFILING COMPLEX SURFACE STRUCTURES USING HEIGHT SCANNING INTERFEROMETRY," the contents said patent and patent application being incorporated herein by reference. It should be understood, however, that processing an interference signals does not require transformation. For example, the maximum of an interference envelope can provide spatial property information even without transformation of the interference signal.

As seen in FIG. 2, a portion 94 of interference signal 90 is dominated by contributions from interference pattern 92 as opposed to interference pattern 96. As discussed above, interference pattern 92 results from the outer surface 39 of object 30. A spatial property, e.g., a position and/or height, of surface 39 can be determined based upon portion 94, which constitutes only a subset of the entire interference signal 90. Methods and systems for locating and analyzing such subsets of interference signals and described in U.S. patent application Ser. No. 09/008,721, titled METHODS AND SYSTEMS FOR INTERFEROMETRIC ANALYSIS OF SURFACES AND RELATED APPLICATIONS by Peter de Groot, filed Sep. 15, 2004. This application is incorporated in its entirety herein by reference.

Interferometry systems and methods for obtaining and processing interference signals, e.g., in some embodiments, low coherence interference signals, from objects, such as objects having a plurality of interfaces are discussed next.

Figure 3:
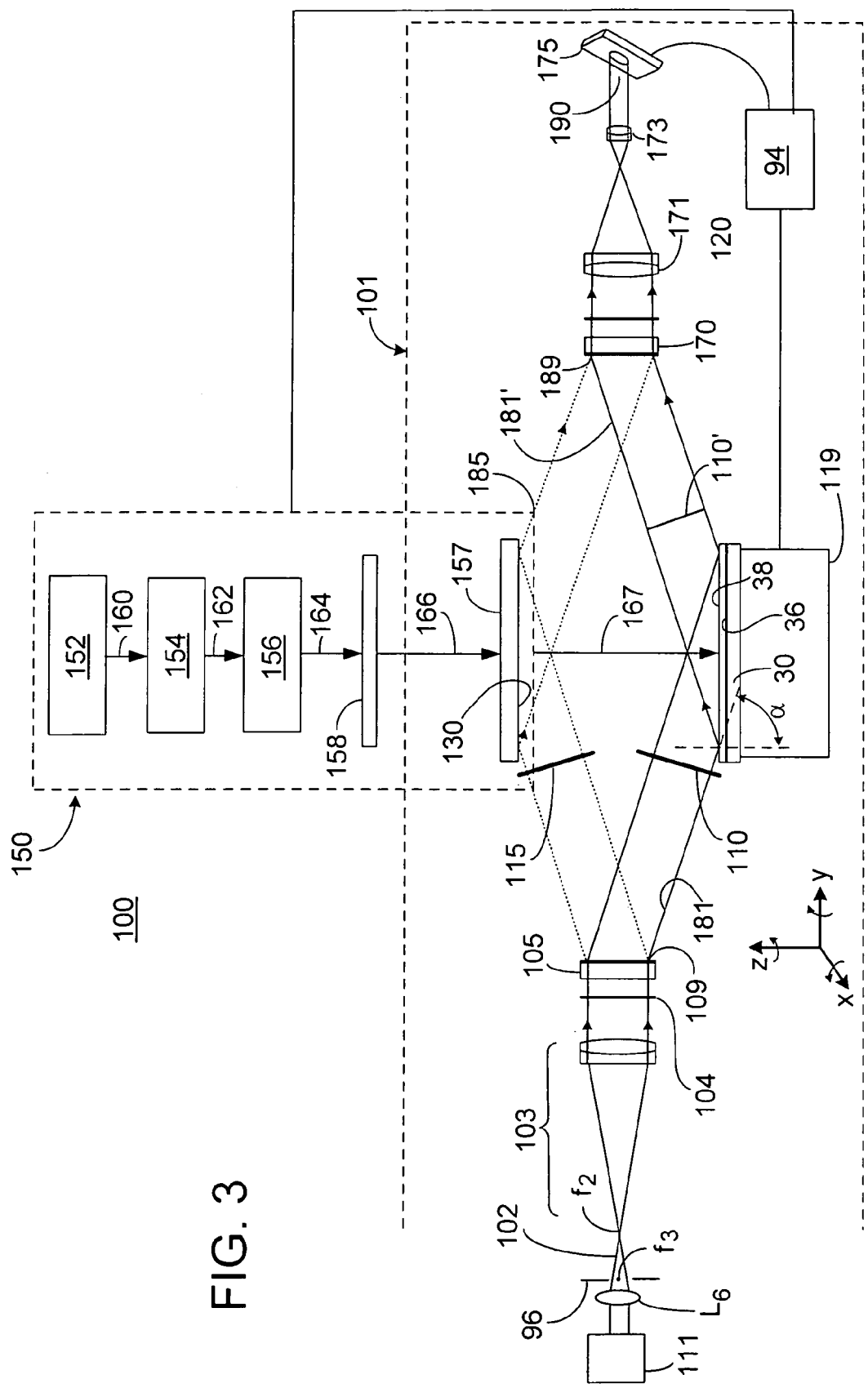
FIG. 3 is a grazing incidence interferometry system.

Referring to FIG. 3, an optical system 100 illuminates uses diffractive optics to illuminate an object at grazing angle of incidence. System 100 includes an interferometry system 101 and an illumination system 150, which systems are configured for use with measurement object 30 and other objects, such as objects lacking any overlying layer or objects including a plurality of such layers. While not a low coherence interferometer, system 101 can determine a characteristic, e.g., a spatial or optical property, of measurement object 30 using grazing incidence illumination and is illustrative of the benefits of such a configuration. With reference back to FIGS. 1a and 1b, the spatial or optical property may be related to surface 39 of layer 34 or a subset 40, thereof. Alternatively, or in combination, the spatial or optical property may be related to interface 36, e.g., to surface 35 of substrate 32. System 101 typically employs phase-shifting techniques to provide information related to object 30.

Illumination system 150 is typically configured to illuminate surface object 30 with light 167, such as to image a selected pattern, e.g., a circuit pattern onto surface 38. Returning to FIG. 3, various aspects of systems 101 and 150 are discussed below.

Interferometry system 101 is a grazing incidence system arranged for analyzing a measurement object. A light source 11, which may be a lamp, a light-emitting diode, a multimode laser diode or a gas laser generates a beam 102. After passing through expansion optics 103, the beam 102 produces an initial illumination wavefront 104. A diffractive-optic beam splitter 105, which may be a linear phase grating with zero-order suppression, separates initial illumination wavefront 104 into a reference wavefront 115 and a measurement wavefront 110. The two wavefronts 115 and 110 result from opposite grating orders, e.g., the positive and negative first grating orders, and consequently travel in divergent directions. Reference wavefront 115 reflects once from reference surface 130 prior to traveling to a diffractive-optic beam combiner 170, which may be similar to diffractive-optic beam splitter 105.

As discussed further below, reference surface 130 may also be configured as a portion of illumination system 150, such as a portion of projection optics that direct patterned light onto object 30, e.g., a subset $40_i$ of the object. In any event, reference surface 130 may be optically flat, e.g., to about 1/15 of the average wavelength of wavefront 115 or have a known surface shape. For example, the projection objects may have an arcuate surface with known curvature.

Referring also to FIG. 1a, a measurement ray 181 illustrates the interaction of light of measurement wavefront 110 with object 30. In the presence of layer 34 and substrate 32, a portion of measurement ray 181 impinges and reflects from layer surface 38 at a grazing angle α, and then travels as a reflected ray 181'. As seen in FIG. 3, a reflected measurement wavefront 110' including ray 181' propagates to diffractive-optic beam combiner 170 where it recombines with the reference wavefront 115 to form an output wavefront 120. Turning back to FIG. 1a, a second portion of measurement ray 181 may penetrate layer 34 and reflect from interface 36 at the surface of substrate 32 as a reflected ray 181". The light reflected from interface 36 generates a second reflected wavefront (not shown) that propagates generally along the same path as wavefront 181' but spaced apart by an amount Δs along a dimension perpendicular to the propagation path. The second wavefront would also combine and interfere with reference wavefront 115.

In some embodiments, system 100 is configured to obtain a single measurement wavefront reflected from surface 39 at the interface 38 between layer 34 and the environment around object 30 and to attenuate or exclude measurement wavefronts reflect from interface 36 between substrate 32 and layer 34. Measurement wavefronts reflected from substrate-surface layer interface 36 can be attenuated or excluded by selecting a source 111 wavelength that is substantially absorbed by the surface layer 34. Because the source light is absorbed by the surface layer, there is essentially no reflected wavefront arising from the substrate-surface layer interface 38. Instead, substantially the only reflected wavefront arises from the surface layer-surroundings interface 38, e.g., an interface between the surface layer and air, other gas, or vacuum surrounding object 30. Hence, ray 181" and any associated wavefronts would be attenuated or excluded.

In some embodiments, the surface layer 34 is photoresist configured to be exposed by ultraviolet light emitted by illumination system 150. Typically, a component of the photoresist layer, e.g., a solvent or an optically active component of the resist itself, absorbs lower energy radiation, such as visible, near-infrared, or infrared radiation, without exposing the optically active component. Such non-exposing absorptions can result from vibrational excitation of the resist rather than electronic excitation as by ultraviolet light. In any event, the resist absorbs a portion of the measurement light and system 101 generates a measurement wavefront including measurement ray 181' and resulting substantially only from the interface 38 between the surface layer 34 and the surroundings. Such a wavefront carries information about spatial properties of the interface 38, e.g., a topography and or position of surface 39. The spatial properties may be given with reference to a portion of illumination system 150, such as surface 130 of projection optics thereof.

In some embodiments, system 100 is configured to obtain a single measurement wavefront reflected from surface 36 at the interface between substrate 32 and layer 34 and to attenuate or exclude measurement wavefronts reflected from interface 38 at the surface of layer 34 and the surroundings. Measurement wavefronts reflected from interface 38 can be attenuated or excluded by selecting the polarization P and angle of incidence α of the incident light, e.g., measurement ray 181, to minimize the intensity of measurement ray 181' relative to measurement ray 181" reflected from surface 36. For example, the polarization P can be configured to be parallel to the plane of incidence at surface 38. Alternatively or in combination, the angle of incidence α can be configured to be equal to Brewster's angle, the angle at which reflection from surface 39 is minimized for the aforementioned polarization. In any event, the reflection from surface 39 is reduced or eliminated and system 101 generates a measurement wavefront including measurement ray 181" and resulting substantially only from the interface 36 between the substrate 32 and surface layer 34. Such a wavefront carries information about spatial properties of the interface 36, e.g., a topography and or position of surface 36 of the substrate. The spatial properties may be given with reference to a portion of illumination system 150, such as surface 130 of projection optics thereof.

Output wavefront 120, whether including information about surface 36, surface 39 or both surfaces, travels through a lens 171 and an imaging lens 173 to a viewing screen, e.g., a two-dimensional detector such as a CCD 175 where an image 190 of sample surface 160 forms. Detector 175 is inclined obliquely to achieve proper focus across the detected image. The tilt also reduces foreshortening in image 190 caused by imaging sample surface 160 at grazing angle α. Image 190 contains interference fringe information related to the topography of sample surface 160. In such interpretations the equivalent wavelength Λ relevant to these fringes is given by $\Lambda = \lambda/\cos(\alpha)$, where λ is the nominal wavelength of wavefront 104.

The term "diffractive-optic", as used herein, is intended to include diffraction gratings, binary optics, surface-relief diffractive lenses, holographic optical elements, and computer-generated holograms. These devices can function in transmission or in reflection as beam splitters and combiners. They may suppress unwanted diffraction orders, e.g., the zero'th order transmission, so as to reduce scattered light and improve efficiency. Methods of fabricating diffractive-optical devices include diamond machining, coherent beam interference (holography), injection molding, and advanced micro-lithographic techniques. Diffractive-optics are recognized by those skilled in the art as distinct from refractive and reflective optical elements such as lenses, prisms, mirrors and plate beam splitters.

When measurement wavefront 110' and reference wavefront 115 come together to form output wavefront 120, overlapping portions of measurement wavefront 110' and reference wavefront 115 originate from substantially the same portion of initial illumination wavefront 104. For example, a reference ray 185 and measurement ray 181 recombining at a point 189 on diffractive-optic beam combiner 170 originate substantially from the same point 109 on diffractive-optic beam splitter 105. As a consequence, aberrations or spatial incoherence in initial illumination wavefront 104 generate, at most, weak effects on the interference fringes observed in image 190. As a further consequence, small defects in beam expansion optics 103 or distortions resulting from air turbulence produce, at most, weak effects on the analysis of image 190. As a further consequence, deviation from flatness in the diffractive-optic beam splitter 105 or the diffractive-optic beam combiner 170 generate, at most, weak effects on the interference fringes observed in image 190.

Any additional characteristic of system 101 is that equivalent wavelength Λ is substantially independent of the wavelength λ of source 111. This may be understood as follows. From the geometry of the system 101 and well-known properties of diffraction gratings, it can be shown that the angle of incidence α is given by $$\cos(\alpha) = \lambda/D,$$

where D is the grating pitch, i.e., the linear separation between grating lines, of the diffractive-optic beam splitter 105 and the diffractive-optic beam combiner 170. Accordingly, the equivalent wavelength Λ=D. Thus, different source wavelengths λ produce the same equivalent wavelength Λ, which is equal to the grating pitch.

The optical path traversed by measurement wavefront 110 is substantially equal to the optical path traversed by reference wavefront 115. This facilitates the use of multimode laser diodes or other devices having a wavelength range sufficient to reduce the effects of spurious fringe patterns and speckle noise characteristic of single-mode lasers or other high-coherence spectrally narrow-band or monochromatic devices, e.g., wavelength range <1 nm, when used as sources for interferometry. The substantial equality of the optical paths traversed by the wavefronts 115 and 110 also desensitizes this first embodiment to instability in the wavelength of source 101, which might otherwise be a problem for laser diodes, which can oscillate between lasing modes unexpectedly.

One method for obtaining interferometry data from system 101 is a phase-shifting method for which a number of interference states are measured by the detector 175. Phase-shifted data can be obtained by introducing an OPD between the measurement and reference beams. Such an OPD can be generated by in-plane translation of one of the diffraction gratings, such as in a direction perpendicular to the grating lines.

Another method for introducing an OPD includes introducing a slight difference in grating period between the two gratings. This creates a tilt between the two wavefronts that interfere at the detector, resulting in a spatial carrier fringe pattern. In this case one of a number of techniques can be used to extract height information from a single exposure of the detector. For example, a Fourier transform phase measurement can be used.

Turning to illumination system 150, an illumination source 152 emits light 160, which is received by a beam conditioner 154. The beam conditioner directs a conditioned beam 162 to illumination optics 156, which transmit light 164 through a mask or reticle 158 onto interface 38 of object 30 via projection optics 157.

Illumination source 152 is typically an ultraviolet source, e.g., a laser emitting an ultraviolet laser beam. In some embodiments, source 152 emits light 160 having a wavelength including 248 nanometers (nm), 193 nm, or 157 nm. Source 152 may be a pulsed laser or a continuous wave laser. Beam conditioner 154 conditions light 160 received from illumination source 152, such as to produce a collimated beam 162 having a defined cross-section. Exemplary beam conditions can include, e.g., refractive and/or reflective optics, such as described in U.S. Pat. No. 5,631,721, titled Hybrid Illumination System for Use in Photolithography, by S. Stanton, et al., incorporated herein by reference in its entirety.

Illumination optics 156 receive conditioned light 162 and output light 164 as an illumination field, which irradiates mask or reticle 158. Optics 156 can be configured to provide an illumination field having a uniform irradiance and to preserve the angular distribution and characteristics of the illumination field at the reticle as the size of the illumination field is varied. Mask or reticle 159 typically includes a pattern, e.g., a circuit pattern, to be projected onto an object. For example, the optics 156 can focus the pattern onto a subset $40_i$ of the object.

Still referring to FIG. 3, the interferometry system 101 provides a large working distance to the interface 38 and reference surface 130. Working distance refers to the distance between a sample surface and the closest optical component. The large working distance in grazing incidence system 101 means that sample interface 38 can be conveniently positioned without concern for possible damage to sample interface 38 or other components.

System 100, like all interferometry systems discussed herein, may include a positioning stage 119 configured to position object 30 with respect to another object, e.g., with respect to surface 130 of projection optics of illumination system 150. Stage 119, which is under computer control with feedback from data acquired by interferometry system 101, provides translational and rotational positioning to bring object 30 into a desired spatial relationship with the other object. For example, based on interferometry data acquired from wavefronts reflected from surface 39 or a subset $40_i$ thereof, system 100 can maneuver object 30 so that surface 39 or a subset $40_i$ thereof is brought into a desired spatial relationship with respect to surface 130, e.g., parallel thereto and/or at a certain distance therefrom. System 100 can maneuver object 30 into a similar spatial relationship between surface 36 and surface 130.

Figure 4:
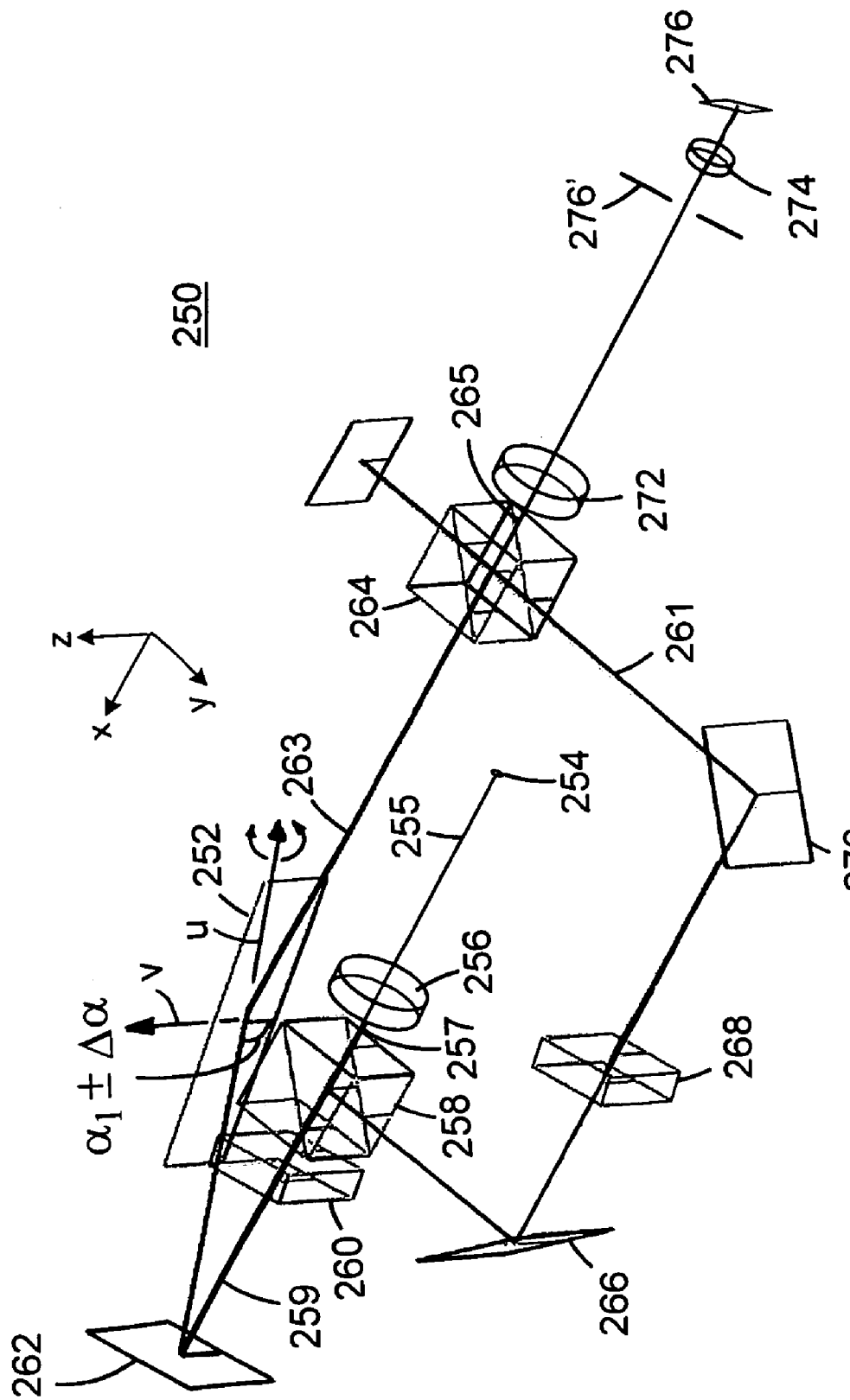
FIG. 4 is a grazing incidence interferometry system.

Referring to FIG. 4, a low coherence interferometry system 250 is another example of a grazing incidence interferometer than can be used to determine a spatial property of an object having a plurality of interfaces. In this embodiment, the system includes a low coherence interferometer with optics can be compactly arranged so that the system occupies a small footprint and can be used in conjunction with other systems used to manipulate an object.

System 250 determines a spatial property of an object 252 by illuminating the object with light at a grazing angle of incidence. System 254 includes a light source 254, which can be a broadband and/or extended source emitting a light beam 255. Exemplary sources include a white light LED having a central wavelength of 550 nm and a full width half maximum (FWHM) of 120 nm and a xenon arc lamp having a 200 nm FWHM. In general, a ratio of a FWHM of light beam 255 to a central wavelength of beam 255 is at least 5%, at least 10%, at least 15%, e.g., at least 20%.

Beam 255 is received by an optic, e.g., a lens 256, which prepares a collimated beam 257. The focal length of lens 265 is (in the embodiment shown) 150 mm, which corresponds to an illumination numerical aperture of 0.004. A beam splitter 258 splits beam 257 into a measurement beam 259 and a reference beam 261. Measurement beam 259 reflects from a mirror 262 and impinges upon object 252 at grazing angle α of incidence. For example, object 252 may be a wafer bearing photoresist to be illuminated by a photolithography system. System 250 has a 25×80 mm field of view of the surface of object 252.

Light 263 reflected by object 252 is received by a beam splitter 264. The optical path of the measurement beam can include a compensator 260, which can be used to modify the distance through dense media, e.g., glass, traveled by the measurement beam and/or to modify a lateral displacement of beam 259. With reference to FIG. 4, beams 259 and 263 occupy a plane parallel to the X-Y plane.

Beam splitter 264 combines light 263 and reference beam 261 to form a beam 265, which is detected by a detector, e.g., an imaging detector 276 having a plurality of detector elements, e.g., pixels. Imaging optics, e.g., telecentric optics 272,274 image the beam 265 at the detector 275 so that different pixels detect light corresponding to different points of object 252. Reference beam 261 can follow a path including mirrors 276,270 and a compensator 268, which can serve the same function as compensator 260.

System 250 can be configured so that an optical path traveled by beam 259 between beam splitters 258 and 264 is identical to an optical path traveled by reference beam 162 between beam splitters 258 and 264. Hence, an optical path difference (OPD) between beams 259,261 may be negligible or zero. Interference is observed when the OPD between the beams is less than a coherence length of the detected light. Moreover, system 250 can be configured to detect beams 259,261 over a range of optical path differences. For example, system 250 can be configured so that one of beams 259,261 travels an initially longer optical path. System 250 then moves at least one component to scan the OPD, e.g., until the OPD reaches zero or until the other beam travels a longer optical path. In some embodiments, system 252 detects beams 259,261 over an OPD range that varies by an amount at least as great as a coherence length of light detected by detector 276. Different detector elements of detector 276 record an interference signal as a function of OPD. The interference signals may resemble interference signal 90 by including one or more interference patterns modulated by an envelope. The interference signals can be analyzed as discussed with respect to system 50 to determine a spatial property of an object, e.g., a spatial property of an outer surface of a layer of photoresist.

Because source 254 is an extended source, it is possible to misalign system 250 so that the OPD varies as a function of position across the reference and measurement beams 259,261, which form images of the source at a pupil plane 276' of optics 272,274. In such misalignment, the optical axes of the reference and measurement legs may be parallel but not coextensive, e.g., parallel but laterally displaced. This results in lateral shear of the illumination bundle. Shear in the XY plane of about 50 µm can reduce fringe contrast by 50%. To reduce or prevent such lost of fringe contrast, system 250 can be aligned to correct lateral shear to within 10 µm or less, 5 µm or less, e.g., 2 µm or less.

Another source of contrast loss can result from rotation of beam 263 about its axis for propagation without a corresponding rotation of beam 261 about its axis of propagation. The rotation of beam 263 can result from rotation of the object about an axis U extending through the object. In fact, alignment seeking to reduce lateral shear can introduce such rotation. The axis U occupies the plane defined by beams 259 and 263. An axis V is normal to the plane defined by beams 259 and 263. Tilting object 252 about the U or V axis laterally displaces the image of the source at pupil 276'. Tilting the about about the U axis, however, also rotates beams 263 about its axis.

Figure 5B:
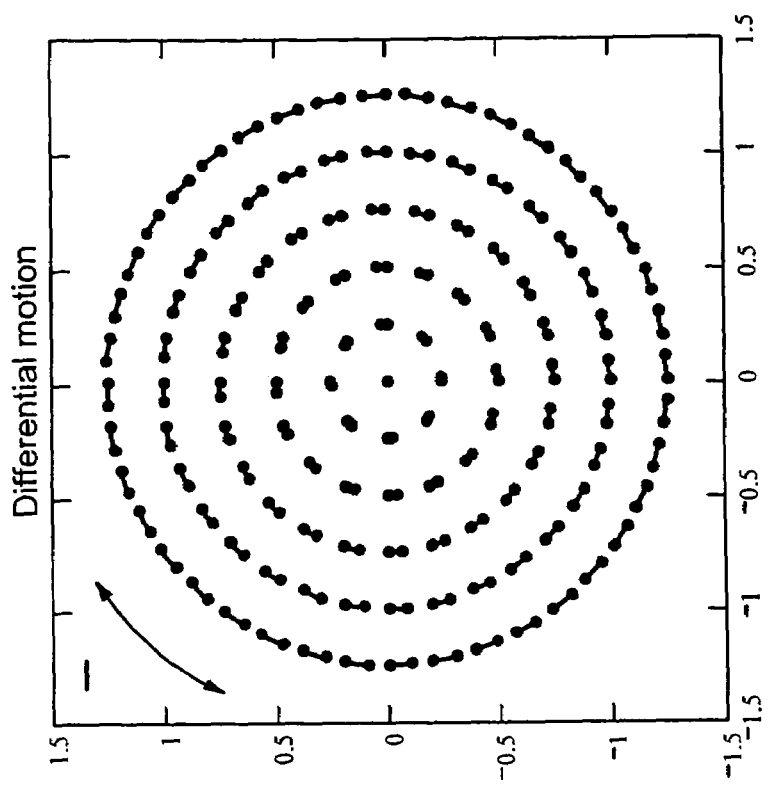
Figure 5A:
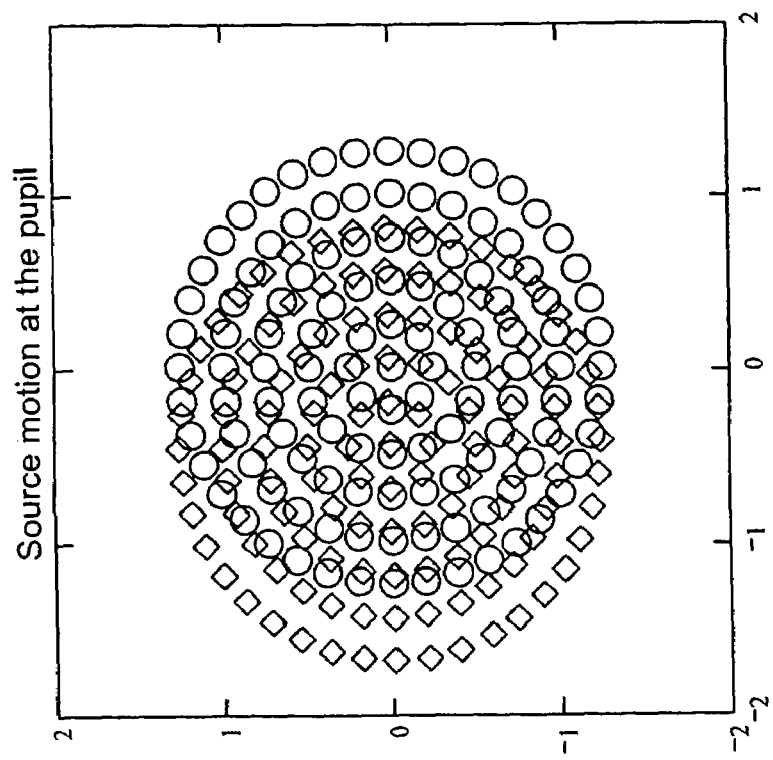
FIG. 5a illustrates shift between light passing along the measurement optical path and reference optical path of the interferometry system of FIG. 4 as a result of a tilt of a measurement object.

Referring to FIGS. 5a and 5b, a simulation of relative displacement of (a) an image of source 254 formed by light passing along the reference leg ○ and an image of the source 254 formed by light passing along the measurement leg ◇ of a grazing incidence interferometer 250 is discussed. The source images are as formed at pupil 276' of telecentric optics 272,274 by beams 261,263. The simulation is for light incident upon an object at an 80° angle of incidence with a numerical aperture of 0.004. In FIG. 5a, the images for the reference and measurement legs show distortion resulting from an object rotation of 0.5° about the U-axis. The measurement leg ◇ image is laterally shifted by 0.44 mm with respect to the reference leg image ○. In FIG. 5b, the rigid body motion of the measurement leg image is subtracted to obtain displacement vectors that demonstrate that beam 263 is, in addition to the lateral displacement, rotated by 0.96° relative to beam 261. The maximum horizontal and vertical distortion of the image reflected from the object is about ±21 µm, which is about ±5% of the 0.44 mm shift. The rotation introduces a ±5% variation in the pitch and orientation of interference fringes that would be detected. Hence, the rotation resulting from object tilt about the U-axis would create a substantial contrast variation over the field of view of the detector. System 250 can be aligned for minimal lateral and rotational shear by, e.g., confining the optical axes of each segment of the reference and measurement legs of the system within the same plane. Object defocus does not affect fringe contrast (to a first approximation) for low numerical aperture interferometers.

Referring to FIG. 6, a low coherence interferometry system 300 determines a spatial property of an object by illuminating the object at a grazing angle of incidence. System 200 includes a low coherence interferometer having a measurement leg and a reference leg. As discussed below, a pair of optical flats act as a beam splitter and beam combiner. Light traveling along the reference leg travels within a gap between the optical flats. Light traveling along the measurement leg can exit the gap between the optical flats to reflect from the object before reentering the gap.

System 200 includes a source 202, which may be broadband and/or extended. Source 202 generates a beam 204. An optic 206 receives beam 204 and outputs a collimated beam 207, which impinges upon a pair of spaced apart optical flats 208,210. Beam 207 is refracted by flat 208 and passes through a gap 233 and impinges upon flat 210 at site 235'. Gap 233 has a different refractive index than either of flats 208,210. In some embodiments, gap 233 includes a gas, e.g., air, a liquid, e.g., water, or a vacuum. The flats 208,210 can be formed of any suitable optical medium, such as glass or fused silica.

A portion 220 of beam 207 is reflected from site 235' by flat 210. A portion 222 of beam 207 is refracted at site 235' by flat 210 and impinges upon object 30 at a grazing angle of incidence α. Beam 222 is reflected by object 30 and impinges upon and is refracted by flat 210. For example, object 30 may be a wafer bearing photoresist to be illuminated by a photolithography system. Beam 222 reflected from object 30 and beam 220 combined at site 235" of flat 210 to form combined beam 224 within gap 233. The combined beam impinges upon and is refracted by flat 208. Imaging optics 226,228 image the combined beams on a detector 230, which can be a two-dimensional imaging detector including a plurality of pixels. Each pixel of detector 230 detects light reflected from a different point of object 30. Hence, different pixels can detect interference signals sensitive to spatial properties of different portions of object 30.

System 200 includes a reference leg and a measurement leg. Beam 220 travels a reference optical path between sites 235' and 235". Beam 22 travels a measurement optical path between sites 235' and 235". An OPD difference between the reference and measurement optical paths can be varied in several ways. In some embodiments, system 200 includes piezoelectric spacers 237 configured to vary a thickness of gap 233. As spacers 237 vary gap 233, detector 230 detects images including a plurality of points of object 30. The OPD can also be scanned by moving object 30 with respect to flats 208,210.

In some embodiments, an OPD is achieved by introducing a wedge into at least one of flats 208,210, e.g., flat 208. The upper and lower surfaces of a flat with such a wedge are not parallel. The wedge tilts the wavefront of the reference beam 220 with respect to the measurement beam 222. Accordingly, the combined beam 224 forms a spatial interference pattern at detector 230. The spatial interference pattern can be processed to determine a height of surface 38 over a line of points parallel to the X-axis. Thus, in a single detector acquisition, system 200 can provide spatial information about object 30. Additionally, object 30 can be positioned absolutely with respect to system 200 by monitoring a lateral location of peak interference contrast of the spatial interference pattern.

Whether the OPD is varied by scanning or to form a spatial interference pattern, the combined beam 224 may be detected over an OPD range that is at least as great as a coherence length of the detected light. Accordingly, system 200 can detect interference patterns modulated by an envelope indicative of the coherence length of the light as discussed with respect to interference signal 90. Interference patterns obtained with system 200 can be analyzed as discussed elsewhere herein to determine a spatial property of an object.

Optical flats 208,210 have optical and mechanical properties that allow system 200 to image a desired field view, e.g., 100 mm×100 mm, of object 30. In some embodiments, the flats are formed of fused silica and are at least 2 mm, at least 5 mm, e.g., at least 10 mm thick.

Surfaces of optical flats 208,210 can be modified to determine the amount of light that is reflected or refracted by each flat. For example, portions 230 of optical flats 208,210 can be modified with an anti-reflection coating configured to increase the relative amount of refracted light compared to the amount of reflected light. The coating can be a broadband coating matched to the emission spectrum of source 202. Light incidence upon portions 235 of optical flat 235 is both reflected and refracted. Accordingly, portions 235 may be uncoated or can be coated to obtain a desired ratio of reflection and refraction. A portion 231 of optical flat 208 can have a highly reflective, e.g., metal or dielectric, coating.

Grazing incidence interferometers discussed herein can be used to determine an absolute position of an object with respect to the interferometer. The reference and measurement legs of the interferometers operate as triangulation sensors. To operate a grazing incidence interferometer as a triangulation sensor, an aperture, e.g., a slit, is positioned in the illumination optics such that the aperture is imaged onto the object surface Interferometer 101 (FIG. 3) is shown with such an aperture 96 although any interferometer discussed herein may be so modified.

The aperture acts as the field stop of a microscope. With reference to FIG. 7a, first and second images 200a,201a of the aperture are imaged onto the detector of the interferometer. Image 200a is an object image corresponding to light reflected from the object. Image 201a is a reference image corresponding to light passing along the reference path of the interferometer. The aperture is small enough that the images 200a, 201a occupy only a fraction of the field of view of the detector. The object is positioned with respect to the interferometer by a staging mechanism, e.g., a translation stage 119 of interferometer 101, that can be accurately displaced along its normal.

When images 200a, 201a are first recorded, the object is typically not positioned so that the OPD of the measurement and reference legs is zero. Accordingly, the images 200a, 201a are spaced apart from one another as seen in FIG. 7a. The relative positions of the object and the interferometer are modified, as by displacing the object along its normal. The object displacement is known precisely and accurately based movement of the translation stage. A second pair of images 200b (a second object image),201b (a second reference image) are then obtained.

The detector signal including images 200a,201a (FIG. 7b) and the detector signal including images 200b,201b (FIG. 7b) are processed to correlate the position of object images 200a,200b in the two detector signals. For example, relative positions of object images images 200a,200b can be determined in terms of spatial units at the detector (for example a number of pixels). The object image displacement as a function of object displacement can be determined from the relative positions of images 200a,200b. Once the relationship between the displacement of the object image and object displacement is determined, the displacement between object image 200b and reference image 201b is determined. The object can then be translated to the position of zero OPD (at which the object image and reference image overlap) based on the displacement between images 200b, 201b and the relationship between object image displacement and object displacement.

As a result of these steps, the object can be positioned with respect to the interferometer with an absolute position of the object surface known to better than a fraction of a fringe of an interference pattern. The grazing incidence interferometer can be switched back to interferometry mode by removing the slit. The position of the object surface can then be refined using interference signals as described herein. The triangulation based on the object and reference images is insensitive to object tilt since the object surface is imaged onto the detector.

Figure 8A:
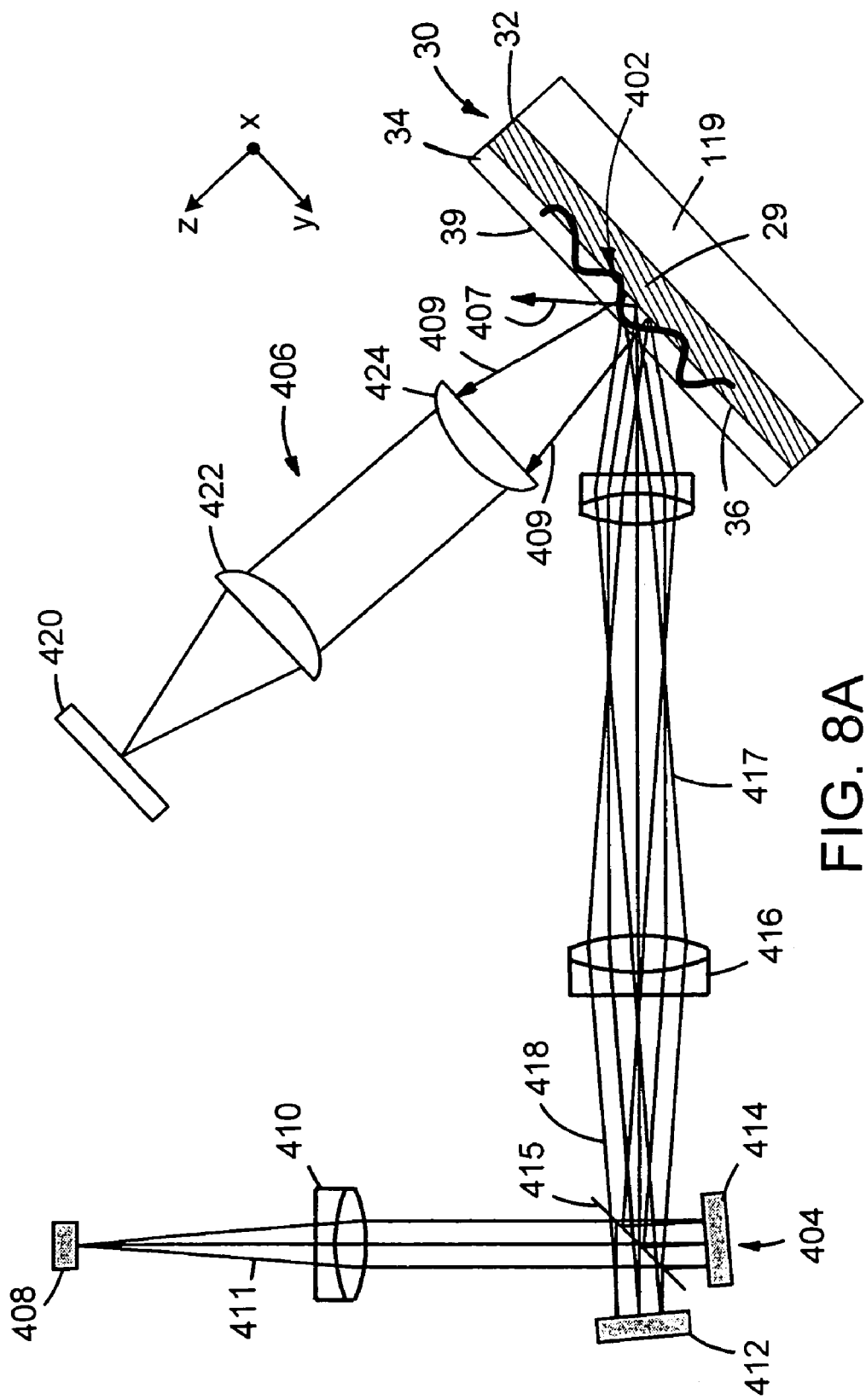
FIG. 8a is a grazing incidence interferometry system.
Figure 8B:
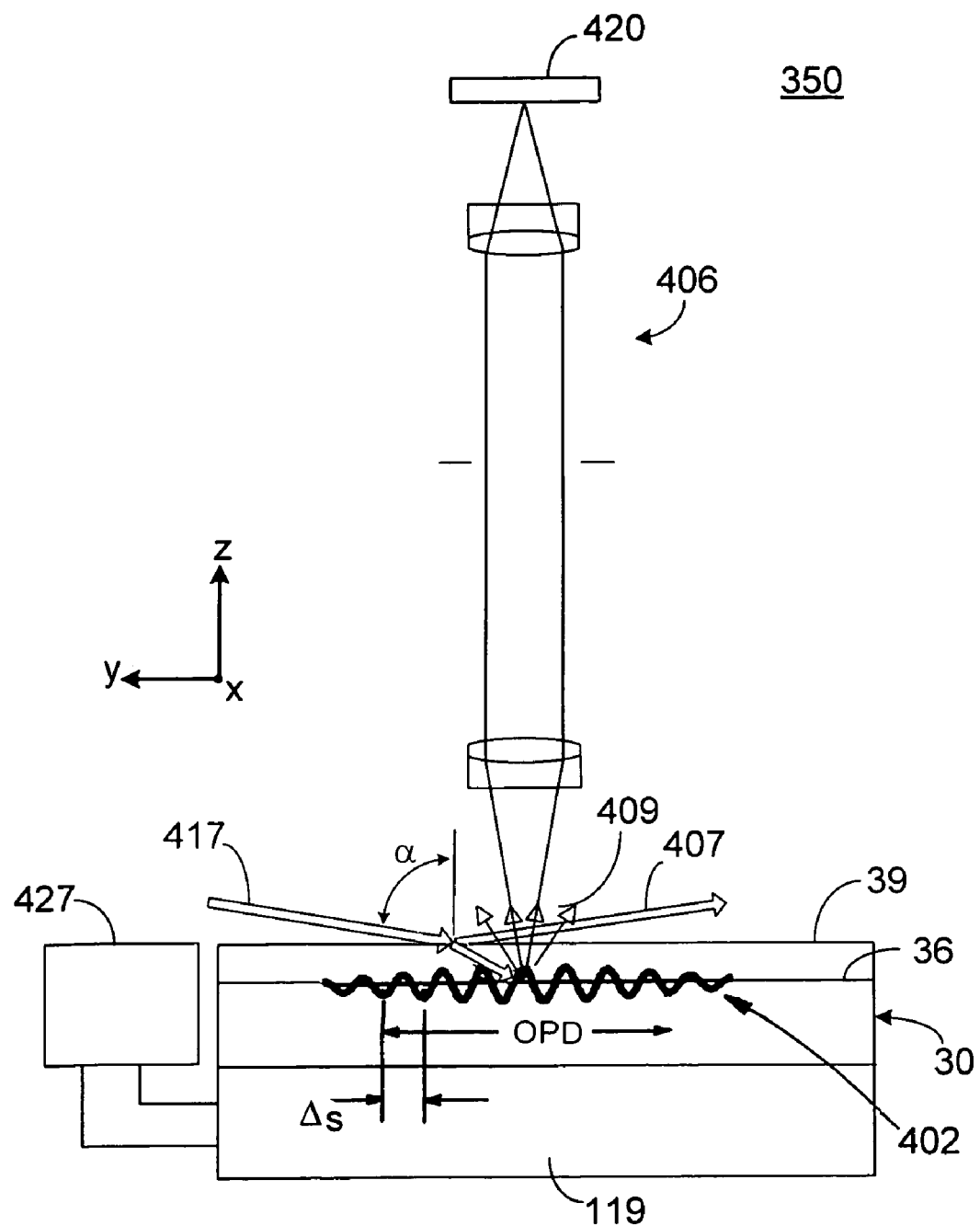

Referring to FIGS. 8a and 8b, and optical system 400 is configured to image light diffusely scattered from an interface between a substrate and a layer overlying the substrate. By imaging the diffusely scattered light, the optical system is sensitive to spatial properties of the interface rather than the outer surface of the object. System 400 can be used to position a substrate having a thin film relative to a photolithography system.

Optical system 400 includes a structured light projector 408, which projects a pattern 402 of light onto the object, and a telecentric imaging system 406, which images the pattern 402 onto a detector 420. Imaging system 406 detects light from the object arising at an angle that avoids light 407 specularly reflected from interface 36 or 38. For example, system 406 may detect light 409 diffusely scattered generally along an optical axis aligned at an angle α with respect to light 407.

The diffuse scattering may arise from patterned features 29 of substrate 32. Such features can be small with respect to a wavelength of light, e.g, 1 μm or less, or 0.5 microns or less. The top surface 39 of layer 34, however, tends to be smooth. Accordingly, the diffuse scattering can be localized with respect to the substrate-layer interface 36. The object top surface 39 and each individual interface, e.g., interface 36, inside the object reflect the illumination light in a specular direction at the angle of incidence, away from the entrance pupil of the imaging system. Hence, the diffusely scattered light 409 is the dominate component of the detected light and system 350 can provide spatial information indicative of the substrate-layer interface based on the detected diffusely scattered light.

In the embodiment shown, structured light projector 404 is a Michelson interferometer including a source 408, which emits a light beam 411, which is collimated by an optic 410, e.g., a lens positioned at its focal length from source 408. In some embodiments, source 408 is broadband and/or spatially extended, such as a light emitting diode. Source 408 may be narrowband or, as discussed below, switchable between narrow and broadband. A beam splitter 415 splits light beam 411 into first and second portions, which respectively reflect from mirrors 412 and 414. Beam splitter 415 recombines at least some light of the first and second portions to form a combined beam 417.

A telecentric optical relay 416 relays the combined beam 417 to the object at a grazing angle of incidence α. The first and second portions of the combined beam 417 impinge on the object with an OPD that differs across the object (FIG. 8b). Hence, the first and second portions of the combined beam interfere at the wafer surface 36 forming interference fringes, i.e., pattern 402. Interference fringes can be observed even if source 408 is broadband and/or spatially extended because the first and second portions of the combined beam 417 can have identical path lengths between beam splitter 415 and the object. Because the source can exhibit some level of incoherence, pattern 402 and the detected image avoid coherent artifacts (speckles). Although structured light projector 404 forms a pattern based on interference fringes, the projector may form a pattern by projecting an image without relying upon interference to form features of the pattern.

Returning to FIGS. 7a and 7b, the fringes formed by patterned light projector extend parallel to the x-axis and are spaced apart along the y-axis of the object. Diffusely scattered light 409 from the fringes is imaged on detector 420, which may be a two-dimensional detector such as a CCD. Several approaches may be used to determine a spatial property of the object based on the detected fringes.

In a spatial carrier approach, the detector is typically configured to detect a plurality of parallel fringes, e.g., the fringes 402 are projected across the entire field of view of the detector. Height variations (such as steps or surface discontinuities of the substrate) will shift the phase of the fringes. With reference to FIG. 8b, a spacing Δs between the fringes is a function of the wavelength of the light of beam 417 and the angle of incidence α. Even if the object and the beam 417 are fixed relative to one another, the angle of incidence α will vary as a function of the surface topography. In particular, the fringe spacing Δs will decrease or increase for portions of interface 36 that are respectively tilted toward or away from beam 417 so as to decrease or increase the angle α. Hence, spatial properties of the object can be determined from even a single image of the pattern 402.

In the spatial-carrier embodiments, one or more detector images of pattern 402 are obtained. A spatial property of the detected portions of the surface, e.g., the height of one or more points of the substrate, is determined based upon the fringes 402, e.g., based upon spacing Δs. The detected image can be analyzed using, e.g., FDA via transformation of the image or directly from the image itself. For example, the spacing Δs can be determined directly from the detected fringes and related to the topography of the object.

In a phase shifting approach, multiple detector exposures of the pattern are recorded while the pattern 402 is shifted across the object. The pattern can be shifted by, e.g., modifying an optical path length of one of the first and second portions of the combined beam. For example, one of the mirrors 412,414 can be translated or tilted using a piezoelectric transducer. The phase of light detected from each of many points of the substrate is indicative of the topography of the substrate.

Exemplary approaches suitable for determining a spatial property of interface 36 based on the projected pattern 402 are described in "Interferogram analysis: digital fringe pattern measurement techniques," D. Robinson, G. Reid Eds., IOP Publishing, 1993, the contents of which are incorporated herein by reference.

In some embodiments, device 350 is operated with a source that is broadband and/or spatially extended. In this case, a temporal and spatial coherence envelope modulates the amplitude of the fringes of pattern 402. The envelope modulates the fringes typically even within the field of view of detector 406. Accordingly, detector 420 images a plurality of parallel fringes, each extending parallel to the x-axis and each having a different intensity than the adjacent fringes. The maximum of the envelope corresponds with the location of zero OPD between the first and second portions of the combined beam. The position of the maximum of the envelope relative to the detected fringes is indicative of the absolute position and orientation of the object. Accordingly, the maximum of the envelope can be used to absolutely localize the object with respect to system 350.

In some embodiments system 400 includes a reference surface 427, which can be located adjacent object 30 and at approximately the same height as surface 35 or surface 39. The object 30 and reference surface 427 may be fixed with a transition stage 119. The reference surface may be configured to diffusely scatter light. For example, the reference surface may be an etched or frosted glass surface. In use with the reference surface, system 350 is typically operated with a broad band source to provide a modulating envelope. The reference surface 427 is positioned so that the pattern is projected onto the reference surface and imaged by the detector. The stage 119 (and thus reference surface 427) are positioned so that the envelope maximum has a predetermined relationship with the observed fringe pattern, e.g., centrally located. Then, the object 30 is translated into the field of view of the detector. A change in the position of the envelope maximum relative to the remainder of the fringes is indicative of a height difference between the reference and object 30. The stage can be moved so that the envelope maximum is once again in the predetermined relationship with the observed fringe pattern. Thus, the object can be positioned absolutely with respect to a reference surface.

In some embodiments, system 400 can be switched between a spectrally broadband and narrowband source. The broadband source operates as discussed above creating an amplitude modulated interference pattern that varies even within the field of view of the detector. The object is positioned based upon the location of the maximum of the interference pattern so that the position of zero OPD coincides with a predetermined portion of the object. Hence, the object can be absolutely positioned with respect to system 400. Once the object is so positioned, the system 400 switches to a narrowband source having a coherence length sufficiently long that the fringes are essentially unmodulated within the field of view of the detector. The properties of the fringes are analyzed to determine a spatial property of the object. The system can use a spectral filter to switch the beam 411 between narrowband and broadband light.

Figure 9A:
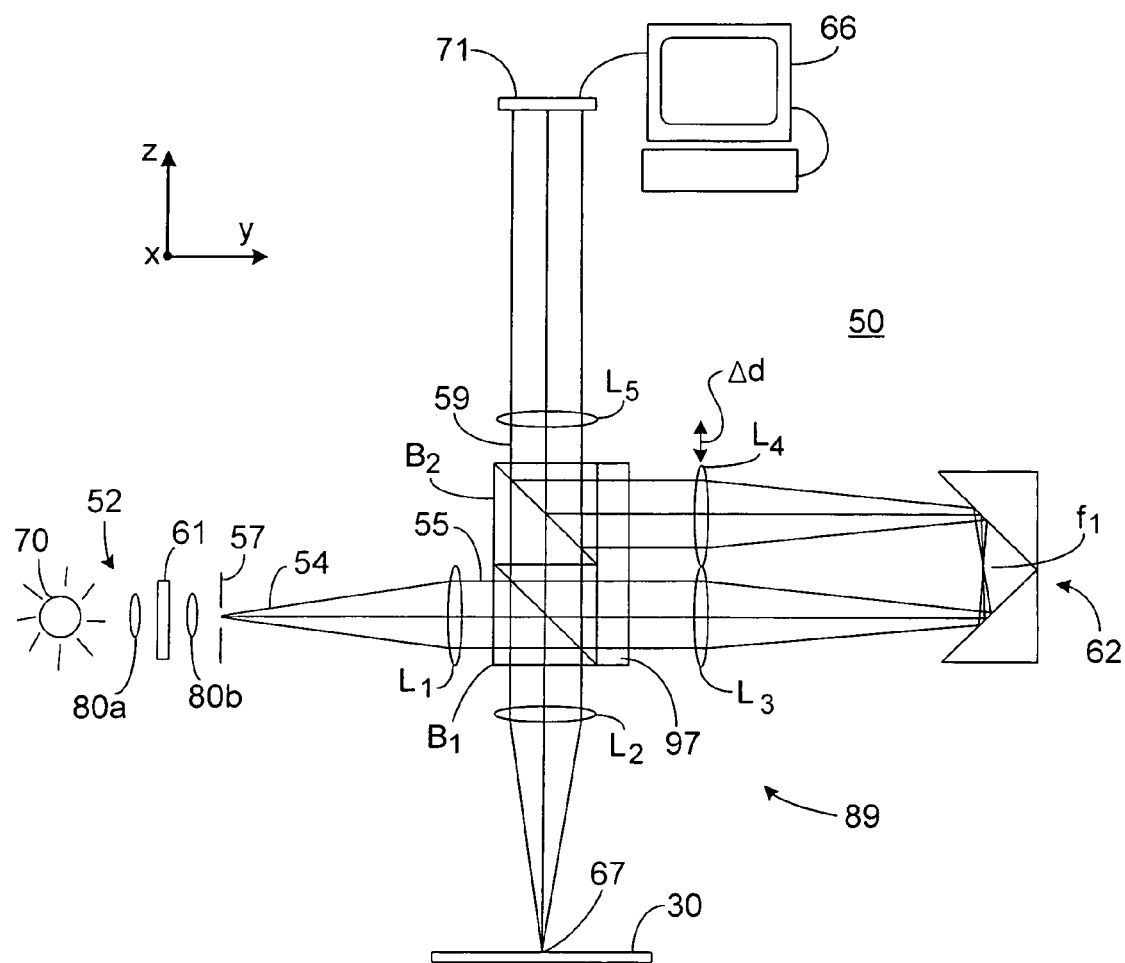
FIG. 9a is a low coherence interferometry system.
Figure 9B:
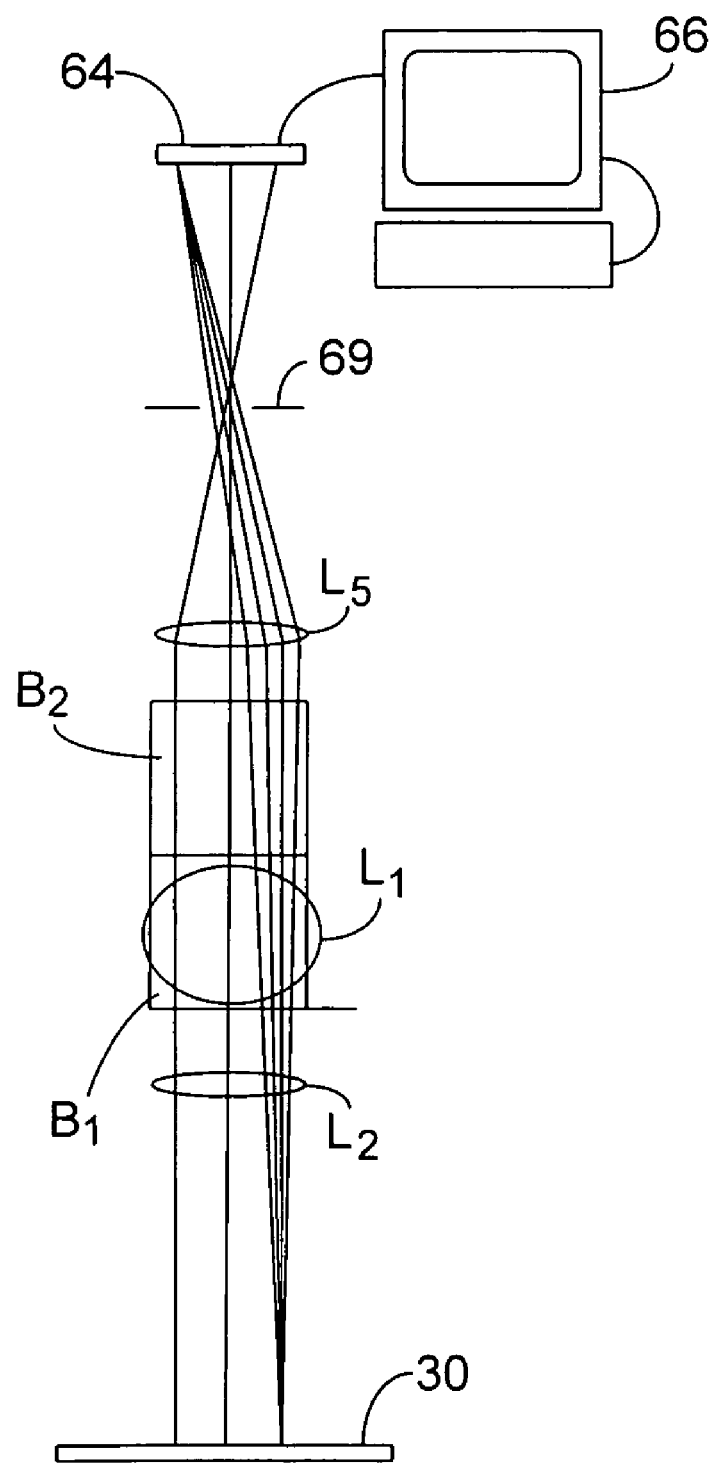
FIG. 9b is the interferometry system of FIG. 9a viewed along the X-axis thereof.

Referring to FIGS. 9a and 9b, an interferometry system 50 can obtain low coherence interference signals from object 30 and other objects, such as objects lacking any overlying layer or objects including a plurality of such layers. System 50 illuminates a plurality of points of an object with an illumination stripe extending in a first dimension and detects an interference pattern resulting from each point. The interference patterns extend along a first dimension of a detector and are spaced apart along a second dimension of the detector. System 50 can, therefore, obtain interference patterns without moving any element that modifies an optical path length difference. Although not necessarily operated in grazing incidence mode, system 50 rapidly obtain interference signals from a plurality of object points for an object being subjected to other processing steps.

A light source, e.g., a light source 52 emits a beam 54 of light elongated in a direction parallel to the X-axis. Source 52 may be a broadband source having a full width at half maximum (FWHM) bandwidth that is at least 5%, at least 10%, at least 15%, or at least 20% of a nominal wavelength of the source. In some embodiments, source 52 has a nominal wavelength of between about 300 nm and about 1000 nm, e.g., between about 500 and about 600 nm.

Beam 54 is received by a cylindrical lens L1, which has a major longitudinal axis parallel both to the X-axis and beam 54 and a minor longitudinal axis parallel to the Y-axis. Lens L1 collimates beam 54 in the Y-Z plane and transmits a collimated beam 55 to a beam splitter B1, which reflects a first portion of the collimated beam 55 to a cylindrical lens L2 and transmits a second portion of the collimated beam 55 to a cylindrical lens L3. Beam splitter B1 is typically non-polarizing. Lens L2 has a major longitudinal axis parallel to the X-axis and a minor longitudinal axis parallel to the Z-axis. Lens L3 has a major longitudinal axis parallel to the X-axis and a minor longitudinal axis parallel to the Y-axis.

With reference to FIG. 9a, lens L2 focuses the reflected portion of the collimated beam received from beam splitter B1 onto the object 30 to an elongated object focus, e.g., an illumination line 67, parallel to the X-axis. A ratio of a dimension of illumination line 67 taken along a major axis thereof (e.g., parallel to the X-axis) to a dimension perpendicular to the major axis thereof (e.g., parallel to the Y-axis) can be at least 5, at least 10, at least 25, at least 50, e.g., at least 100. Such dimensions of illumination line 67 may be determined from locations corresponding to 25% of the maximum illumination intensity. Illumination line 67 may have a generally uniform or slowly varying intensity along its length and irradiates a plurality of points of object 30. The points may be considered as being spaced apart along an illumination dimension of the object 30, e.g., the X-axis.

With reference to FIG. 9b, light reflected by object 30, e.g., light reflected from interface 36 and/or surface 39, is received by lens L2, which collimates the reflected light in the Y-Z plane and transmits the collimated light to beam splitter B1, which transits a portion of the light to a beam splitter B2, which is typically non-polarizing. Light that passes from beam splitter B1, reflects from object 30, and passes to beam splitter B2 travels a measurement optical path.

The second portion of the collimated beam transmitted by B1 is received by lens L3, which transmits a converging beam to a 90° roof mirror 62. The converging beam comes to a focus f1, which is typically elongated and extends parallel to the X-axis. The roof mirror 62 transmits a diverging beam to a cylindrical lens L4, which has a major longitudinal axis aligned with the X-axis and a minor longitudinal axis aligned with the Y-axis. Lens L4 transmits a beam collimated in the Y-Z plane to beam splitter B2. Lenses L2, L3, and L4 may have identical optical properties, e.g., focal lengths. Lenses and other optics of system 50 may be achromatic. Light passing from beam splitter B1 and to beam splitter B2 via roof mirror 62 travels a reference optical path. The measurement optical path defines a measurement leg of an interferometer 89 of system 50. The reference optical path defines a reference leg of the interferometer 89 of system 50.

Beam splitter B2 combines light from the measurement and reference legs of interferometer 89 and transmits a combined beam 59. The contributions to combined beam 59 from both the measurement and reference legs are collimated in the Y-Z plane. Beam 59 may be diverging in the X-Z plane. A cylindrical lens L5 receives the combined beam 59 and focuses the light on a detector, which is typically a two dimensional detector 71 including a plurality of pixels 73, arranged in rows extending along the Y-axis and columns extending along the X-axis. Different columns have a different Y-coordinate. Different rows have a different X-coordinate. Detector 71 may be a charge coupled device (CCD) or other imaging detector. Lens L5 has a major longitudinal axis aligned with the Y-axis and a minor longitudinal axis aligned with the Z-axis. Accordingly, lens L5 has substantially more focusing power in the X-Z plane than in the Y-Z plane, e.g., lens L5 may have essentially no focusing power in the Y-Z plane.

Figure 10:
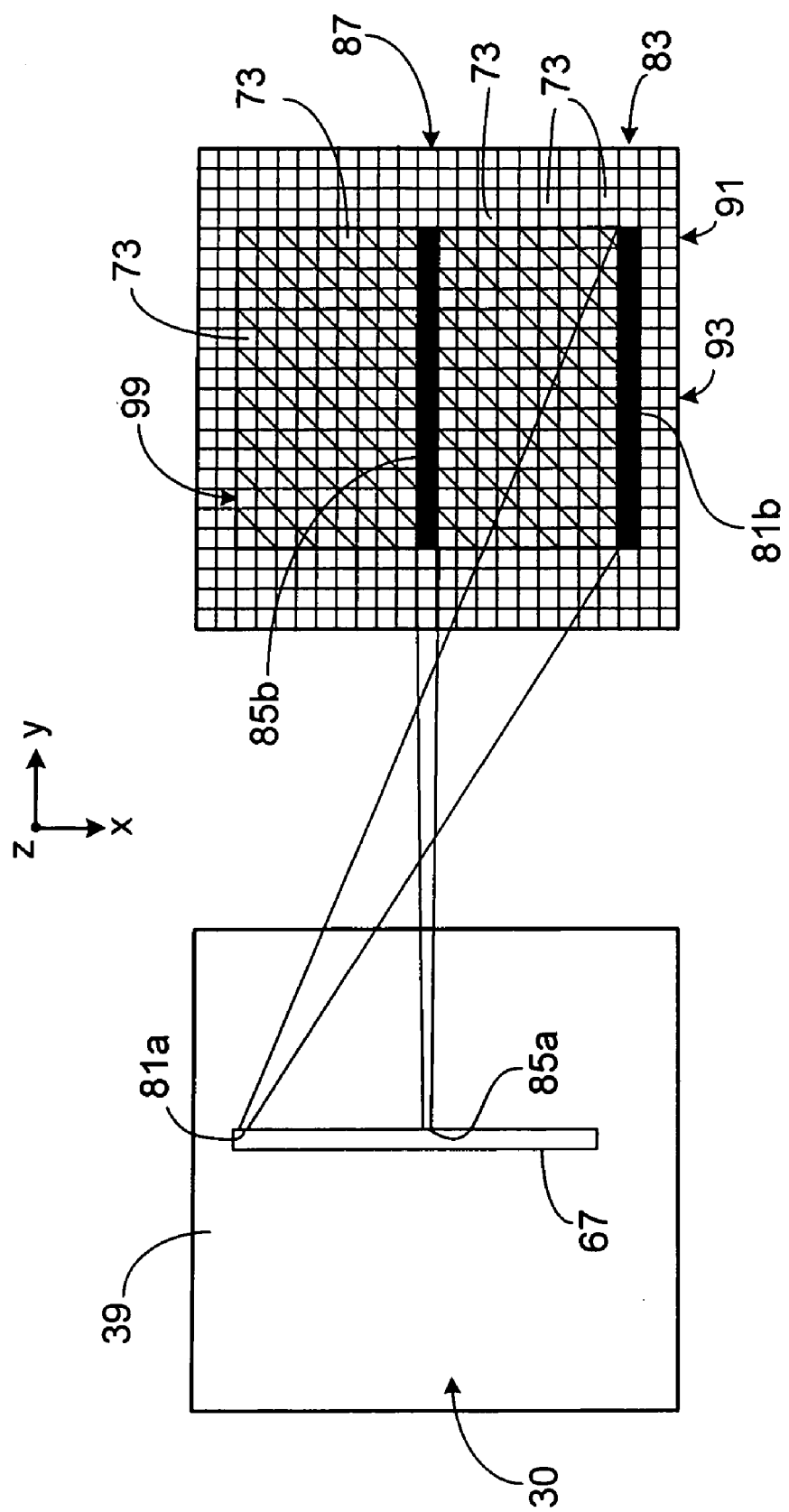

With reference to FIG. 10, interferometer 50 images light from the measurement and reference legs onto detector 71. Light reflected from each illuminated point of object 30 is imaged as an elongated focus, e.g., a detection line. For example, light from an illuminated point 81a is imaged to a corresponding elongated focus 81b along a pixel row 83 of detector 71 and light from an illuminated point 85a is imaged to a corresponding elongate focus 85b along a pixel row 87 of detector 71. Light from focus f1 of the reference leg is imaged as a reference focus 99, which overlaps elongated foci corresponding to the illuminated points of object 30.

A ratio of a dimension of each elongated focus 81b,85b taken along a major axis thereof (e.g., parallel to the Y-axis) to a dimension perpendicular to the major axis thereof (e.g., parallel to the X-axis) can be at least 5, at least 10, at least 25, at least 50, e.g., at least 100. As seen in FIG. 4, elongated foci corresponding to points spaced apart along the illumination dimension of object 30 are spaced apart along a first detection dimension of detector 71, e.g., elongated foci 81b,85b corresponding to spaced apart points 81a,85a are imaged into different rows of pixels 73 and are spaced apart along the X-axis of detector 71. The major axis of each elongated focus extends along a second detection dimension generally perpendicular to the first detention dimension, e.g., elongated foci 81b,85b extend across a plurality of columns of pixels 73 and extend along the Y-axis of detector 71. Accordingly, interferometer 50 can image light reflected from a plurality of points extending along an illumination dimension of an object as a two-dimensional image. Illuminated points spaced apart along the illumination dimension are imaged as elongated foci spaced apart along a first dimension of the image and extending along the second dimension of the image.

Returning to FIG. 9a, the reference and measurement legs of interferometer 89 may be configured to have a nominally equal path length when lenses L1-L5 are centered with respect to the optical paths of interferometer 89. In the equal path length state, an OPD between elongated foci 81b,85b and reference focus 99 may be constant along the rows of detector 71 (FIG. 4). An optical medium having a refractive index greater than 1, e.g., a silica or glass plate 97, can be positioned along the reference optical path between beam splitters B1,B2 and the lenses L3, L4 in order to match the optical path in such media of the two interferometer legs.

In some embodiments, an OPD between the measurement and reference legs of interferometer 98 is introduced by translating lens L4 by an amount Δd perpendicular to the reference optical path, e.g., by translating lens L4 parallel to the Z-axis (FIG. 10). The translation of an optic, e.g., lens L4, perpendicular to the reference optical path causes the beam passing along the reference leg to deviate, e.g., tilt, by an angle θ with respect to the beam passing along the reference leg in the absence of such a translation, e.g., the reference beam may deviate with respect to a true reference optical path. The deviation of the angle θ may be contained in a single plane, e.g., the X-Y plane.

The angular deviation of the reference beam creates an OPD variation between each elongated focus 81b,85b and reference focus 99. In particular, the OPD between the measurement and reference optical paths varies along the major axis of each elongated focus on the detector, e.g., along foci 81b,85b. For example, an OPD between the measurement and reference optical paths for light imaged to a column 91 of detector 71 is different from an OPD for light imaged to a column 93 (FIG. 10). Hence, in the embodiment shown, the OPD between the measurement and reference optical paths varies as a function of the Y-coordinate of detector 71. In some embodiments, the OPD is a linear function of the Y coordinate, e.g., the OPD is a linear function of the column of detector 71 at which the light is imaged. For example, with reference to FIG. 10, the OPD varies, e.g., linearly, along the rows of detector 71 and, therefore, along the major dimension of the elongated foci 81b,85b. Because the major axis of the elongated focus corresponding to each illuminated points of object 30 extends generally across the rows of detector 71, each row of pixels records an interference signal, which includes one or more interference patterns. Typically, each interference pattern of an interference signal results from a particular interface of the object. The detector pixel in each column along a given row corresponds to a different OPD. Hence, one detector dimension corresponds to a line of object positions, while the other dimension provides multiple phase-shifted samples of the interference pattern generated by each object point. Scanning the object in the Y-direction allows sequentially profiling the entire object surface.

Returning to FIG. 2, interference signal 90 is exemplary of the intensity variation of light detected by pixels along rows of detector 71, e.g., along detector row 83 for point 81a of object 30. The OPD difference of light detected along a row can vary by an amount at least as large as the coherence length of the detected light. For example, as shown, the range of optical path differences of light detected along the pixels of one or more rows can be larger than the full width of the envelope modulating each of one or more detected interference patterns. Because of the low-coherence nature of the interference signal, a position and/or height of point 81a can be established without ambiguity with respect to the system 50.

Because interference signals obtained with system 50 are spread out spatially for different object points, a single exposure of the detector allows profiling an entire line of points at the object surface. Once object 30 has been brought into an initial focus with respect to illumination line 67, an interference pattern for each of a plurality of points spaced apart along a first dimension of object 30 can be acquired without moving any portion of system 50. Accordingly, in some embodiments, interferometer 89 does not have moving parts or does not move any parts during the acquisition of interference patterns from each of a plurality of spaced apart object points and can be manufactured as a rigid or fixed assembly.

The range of illumination angles at the object 30 can be made arbitrarily small by increasing the focal length of the optics of interferometer 89. Accordingly, variations in the optical properties of the object surface that are related to angle of incidence are effectively reduce or eliminated. Each detected interference pattern is equivalent to the signal that would be detected at a single detector pixel if the optical path in the test or reference leg were scanned continuously.

As discussed above, the OPD between the measurement and reference beams may be obtained by decentering an optic, e.g., lens L4 with respect to an optical path of the reference beam. In some embodiments, obtaining an optical path difference includes adjusting roof mirror 62 to introduce an angular deviation to the reference beam. In some embodiments, obtaining an OPD includes rotating or tilting beam splitter B2 about the X-axis.

Referring to FIGS. 9a and 9b, system 50 is, in some embodiments, configured to reduce or eliminate a wavefront inversion of the reference beam with respect to the measurement beam. Wavefront inversion can be reduced or eliminated by having the same number of reflections in each leg of the interferometer or an even multiple thereof. As seen in FIG. 11a, wavefront inversion introduced by roof prism 62 is evidenced by the inversion of beams 77a,77b upon reflection. As seen in FIG. 11b, a three mirror reflector 62b does not introduce wavefront inversion as evidenced by the paths of beams 77c,77d. Reducing wavefront inversion can enhance accuracy of interferometer 89.

Referring back to FIG. 9a, source 52 may include a slit 57 having a major dimension extending generally parallel to the X-axis. The projected width of the slit 57 in the Y-direction defines the lateral resolution of system 50 in the Y-direction while the numerical aperture of lens L5 in the X-dimension defines lateral resolution in the X-direction. Slit 57 can be defined by, for example, mechanical aperture or a linear fiber array. In some embodiments, source 52 includes a spatial filter to limit the divergence of the illumination beam in the XZ plane. An exemplary spatial filter includes a slit 61 having a major dimension extending generally parallel to the Z-axis and telecentric lenses 80a,80b, which image a Lambertian emitter 70 onto slit 57.

Although illumination line 67 typically has a uniform intensity, in some embodiments, the line may be non-uniform. For example, light source 52 may include the ends of a plurality of optical fibers arranged in an elongated array, e.g., slit. Lenses L1,L2 may image light emitted from the elongated array to illuminate object 30 with light having a non-uniform intensity.

PROCESSORS

Any of the computer analysis methods described above can be implemented in hardware or software, or a combination of both. The methods can be implemented in computer programs using standard programming techniques following the method and figures described herein. Program code is applied to input data to perform the functions described herein and generate output information. The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The analysis method can also be implemented as a computer-readable storage medium, configured with a computer program, where the storage medium so configured causes a computer to operate in a specific and predefined manner to perform the functions described herein.

EXEMPLARY APPLICATIONS

The low coherence interferometry methods and systems described above may used for any of the following surface analysis problems: simple thin films; multilayer thin films; sharp edges and surface features that diffract or otherwise generate complex interference effects; unresolved surface roughness; unresolved surface features, for example, a sub-wavelength width groove on an otherwise smooth surface; dissimilar materials; polarization-dependent properties of the surface; and deflections, vibrations or motions of the surface or deformable surface features that result in incident-angle dependent perturbations of the interference phenomenon. For the case of thin film, the variable parameter of interest may be the film thickness, the refractive index of the film, the refractive index of the substrate, or some combination thereof. For the case of dissimilar materials, for example, the surface may comprise a combination of thin film and a solid metal, and a fit of the angle-dependent surface properties would be made to a library of theoretical predictions which would include both surface structure types to automatically identify the film or the solid metal by a match to the corresponding interference intensity signal. Exemplary applications including objects and devices exhibit such features are discussed next.

PHOTOLITHOGRAPHY

In many microelectronics applications, photolithography is used to pattern a layer of photoresist overlying a substrate, e.g., a silicon wafer. In terms of object 30, substrate 32 may correspond to a wafer and layer 34 with a thin layer of photoresist. The interface 38 corresponds with the upper surface of the photoresist and interface 36 corresponds with the wafer-photoresist interface. Surface 35 of the substrate may have a plurality of patterned features of varying topography and/or composition that underlie the photoresist. Accordingly, the object may exhibit a plurality of interfaces underlying the photoresist outer surface.

A photolithography apparatus images a pattern onto the object. For example, the pattern may correspond with elements of an electronic circuit (or the negative of the circuit). After imaging, portions of the photoresist are removed revealing the substrate underlying the removed photoresist. The revealed substrate can be etched, covered with deposited material, or otherwise modified. Remaining photoresist protects other portions of the substrate from such modification.

To increase manufacturing efficiencies, more than one device is sometimes prepared from a single wafer. The devices may be the same or different. Each device requires that a subset of the wafer be imaged with a pattern. In some cases, the pattern is sequentially imaged onto different subsets. Sequential imaging can be performed for several reasons. Optical aberrations can prevent achieving adequate pattern focus quality over larger areas of the wafer. Even in the absence of optical aberrations, the spatial properties of the wafer and photoresist may also prevent achieving adequate pattern focus over large areas of the wafer. Aspects of the relationship between the spatial properties of the wafer/resist and focus quality are discussed next.

Figure 1B:
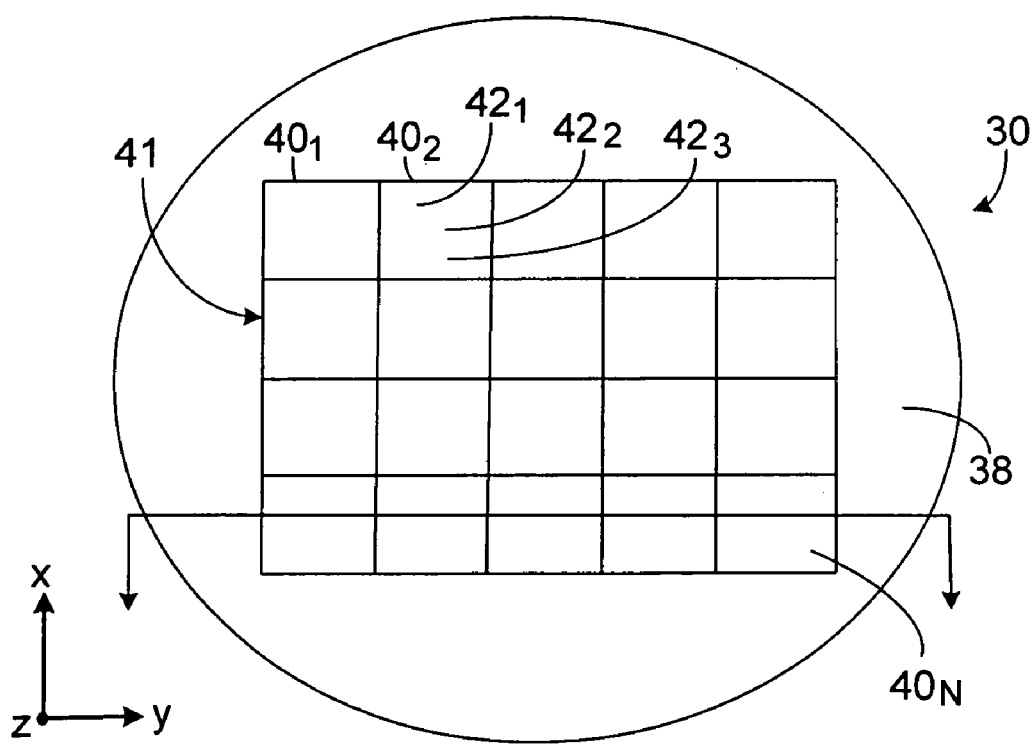

Referring to back to FIG. 1b, object 30 is shown with a number N subsets $40_i$, each smaller than a total area 41 the object to be imaged. Within each subset 40, spatial property variations, e.g., height and slope variations of the wafer or photoresist, are typically smaller than when taken over the total area 41. Nonetheless, the wafer or photoresist of different subsets $40_i$ typically have different heights and slopes. For example, layer 34 exhibits thicknesses $\Delta t_1$ and $\Delta t_2$, which vary the height and slope of surface 39 (FIG. 1a). Thus, each subset of the object may have a different spatial relationship with the photolithography imager. The quality of focus is related to the spatial relationship, e.g., the distance between the object and the photolithography imager. Bringing different subsets of the object into proper focus may require relative repositioning of the object and imager. Because of the object height and slope variations, proper subset focus cannot be achieved solely by determining the position and orientation of the object with respect to a portion of the object that is remote to the imaged subset, e.g., a side 43 of the object.

Proper focus can be achieved by determining a spatial property of an object within a subset of the object to be imaged (or otherwise processed). Once the position of the subset has been determined, the object (and/or a portion of the photolithography imager) can be moved, e.g., translated, rotated, and/or tilted, to modify the position of the subset with respect to a reference, e.g., a portion of the photolithography imager. The determination and movement (if necessary) can be repeated for each subset to be imaged.

The determination of the spatial property of the subset can include determining a position and/or height of one or more points of an outer surface of a thin layer of the object, the one or more points lying within the subset of the object to be imaged. For example, the position and orientation of the outer surface 39 of subset $40_2$ (FIG. 1a) can be determined based upon the positions of points $42_1$-$42_3$ within the subset. The determination of the spatial property of the subset to be imaged can include using an interferometer to illuminate the subset with light and detecting an interference signal including light reflected from the illuminated subset. In some embodiments, a plurality of subsets are simultaneously imaged with light to obtain a plurality of interference signals. Each interference signal is indicative of one or more spatial properties of a subset. Thus, the interference signals can be used to prepare an image indicative of the topography of the object over a plurality of the subsets. During photolithography of the subsets, the wafer is positioned based upon the topography of the individual subsets as determined from the plurality of interference signals. Hence, each subset can be positioned for optimum focus with respect to the photolithography apparatus.

Detecting an interference signal from each subset of an object to be imaged can include detecting light reflected from the subset and reference light over an OPD range that is at least as large as a coherence length of the detected light. For example, the light may be detected at least over its coherence length. In some embodiments, the interferometer is configured so that the light reflected from the illuminated subset is dominated by light reflected from either an outer interface (such as outer surface 39) or an inner interface (such as interface 36). In some embodiments, a spatial property of an object is determined based on only a portion of the interference signal. For example, if the interference signal includes two or more overlapping interference patterns, a spatial property of the object can be determined based upon a portion of one of the interference patterns that is dominated by contributions from a single interface of the object.

COPPER INTERCONNECT STRUCTURES AND CHEMICAL MECHANICAL POLISHING

It is becoming common among chip makers to use the so-called 'dual damascene copper' process to fabricate electrical interconnects between different parts of a chip. This is an example of a process which may be effectively characterized using a suitable surface topography system. The dual damascene process may be considered to have six parts: (1) an interlayer dielectric (ILD) deposition, in which a layer of dielectric material (such as a polymer, or glass) is deposited onto the surface of a wafer (containing a plurality of individual chips); (2) chemical mechanical polishing (CMP), in which the dielectric layer is polished so as to create a smooth surface, suitable for precision optical lithography, (3) a combination of lithographic patterning and reactive ion etching steps, in which a complex network is created comprising narrow trenches running parallel to the wafer surface and small vias running from the bottom of the trenches to a lower (previously define) electrically conductive layer, (4) a combination of metal deposition steps which result in the deposition of copper trenches and vias, (5) a dielectric deposition step in which a dielectric is applied over the copper trenches and vias, and (6) a final CMP step in which the excess copper is removed, leaving a network of copper filled trenches (and possible vias) surrounded by dielectric material.

Referring to FIG. 12a, a device 500 is exemplary of the a film structure resulting from the deposition of a dielectric 504 over copper features 502 deposited on a substrate 501. The dielectric 504 has a non-uniform outer surface 506 exhibiting height variations therealong. Interference signals obtained from device 500 can include interference patterns resulting from surface 506, an interface 508 between copper features 502 and dielectric 504, and an interface 510 between substrate 501 and dielectric 504. The device 500 may include a plurality of other features that also generate interference patterns.

Referring to FIG. 12b, a device 500' illustrates the state of device 500 after the final CMP step. The upper surface 506 has been planarized to a surface 506', and interface 508 may now be exposed to the surroundings. Interface 510 at the substrate surface remains intact. Device performance and uniformity depends critically on monitoring the planarization of surface 504. It is important to appreciate that the polishing rate, and therefore the remaining copper (and dielectric) thickness after polishing, depends strongly and in a complex manner on the polishing conditions (such as the pad pressure and polishing slurry composition), as well as on the local detailed arrangement (i.e., orientation, proximity and shape) of copper and surrounding dielectric regions. Hence, portions of surface 506 over copper elements 502 may etch at different rates that other portions of surface 506. Additionally, once interface 508 of copper elements 502 is exposed, the dielectric and copper elements may exhibit different etch rates.

The 'position dependent polishing' is known to give rise to variable surface topography on many lateral length scales. For example, it may mean that chips located closer to the edge of a wafer on aggregate are polished more rapidly than those located close to the center, creating copper regions which are thinner than desired near the edges, and thicker than desired at the center. This is an example of a 'wafer scale' process nonuniformity—i.e., one occurring on length scale comparable to the wafer diameter. It is also known that regions which have a high density of copper trenches polish at a higher rate than nearby regions with low copper line densities. This leads to a phenomenon known as 'CMP induced erosion' in the high copper density regions. This is an example of a 'chip scale' process non-uniformity—i.e., one occurring on a length scale comparable to (and sometimes much less than) the linear dimensions of a single chip. Another type of chip scale nonuniformity, known as 'dishing', occurs within single copper filled trench regions (which tend to polish at a higher rate than the surrounding dielectric material). For trenches greater than a few microns in width dishing may become severe with the result that affected lines later exhibit excessive electrical resistance, leading to a chip failure.

CMP induced wafer and chip scale process nonuniformities are inherently difficult to predict, and they are subject to change over time as conditions within the CMP processing system evolve. To effectively monitor, and suitably adjust the process conditions for the purpose of ensuring that any nonuniformities remain within acceptable limits, it is important for process engineers to make frequent non-contact surface topography measurements on chips at a large number and wide variety of locations. This is possible using embodiments of the interferometry methods and systems described above.

In some embodiments one or more spatial properties, e.g., the topography of surface 506 and/or the thickness of dielectric 504, are monitored by obtaining low coherence interference signals from the structure before and/or during CMP. Based on the spatial properties, the polishing conditions can be changed to achieve the desired planar surface 506'. For example, the pad pressure, pad pressure distribution, polishing agent characteristics, solvent composition and flow, and other conditions can be determined based on the spatial properties. After some period of polishing, the spatial property can again be determined and the polishing conditions changed as needed. The topography and/or thickness is also indicative of the end-point at which, e.g., surface 504' is achieved. Thus, the low coherence interference signals can be used to avoid depressions caused by over polishing different regions of the object. The low coherence interference methods and systems are advantageous in this respect because spatial properties of the device, e.g., the relative heights of the surface of the dielectric (a) over copper elements 502 and (b) over substrate surface 510 but adjacent copper elements 502 can be determined even in the presence of the multiple interfaces.

SOLDER BUMP PROCESSING

Figure 13A:
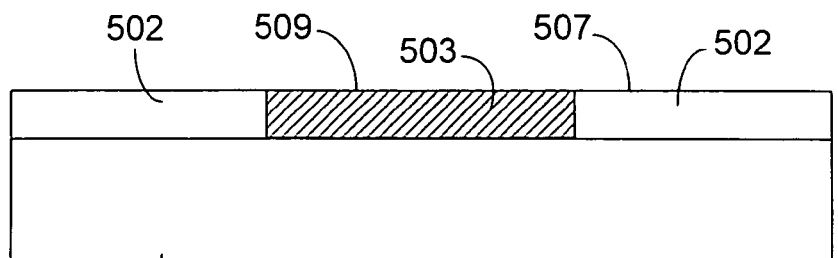
FIGS. 13a and 13b are exemplary structures formed during solder bump processing.
Figure 13B:
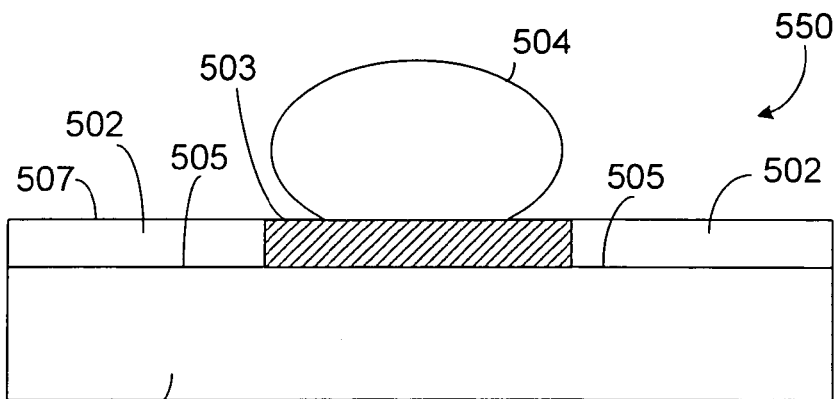

Referring to FIGS. 13a and 13b, a structure 550 is exemplary of a structure produced during solder bump processing. Structure 550 includes a substrate 551, regions 502 non-wettable by solder, and a region 503 wettable by solder. Regions 502 have an outer surface 507. Region 503 has an outer surface 509. Accordingly, an interface 505 is formed between regions 502 and substrate 501.

During processing a mass of solder 504 is positioned in contact with wettable region 503. Upon flowing the solder, the solder forms a secure contact with the wettable region 503. Adjacent non-wettable regions 502 act like a dam preventing the flowed solder from undesirable migration about the structure. It is desirable to know spatial properties of the structure including the relative heights of surfaces 507,509 and the dimensions of solder 504 relative to surface 502. As can be determined from other discussions herein, structure 550 includes a plurality of interfaces that may each result in an interference pattern. Overlap between the interference patterns prevents accurate determinate of the spatial properties using known interference techniques. Application of the systems and methods discussed herein allow the spatial properties to be determined.

Spatial properties determined from structure 550 can be used to change manufacturing conditions, such as deposition times for layers 502,503 and the amount of solder 504 used per area of region 503. Additionally, heating conditions used to flow the solder can also be changed based on the spatial properties to achieve adequate flow and or prevent migration of the solder.

LIQUID CRYSTAL DISPLAYS

Figure 14:
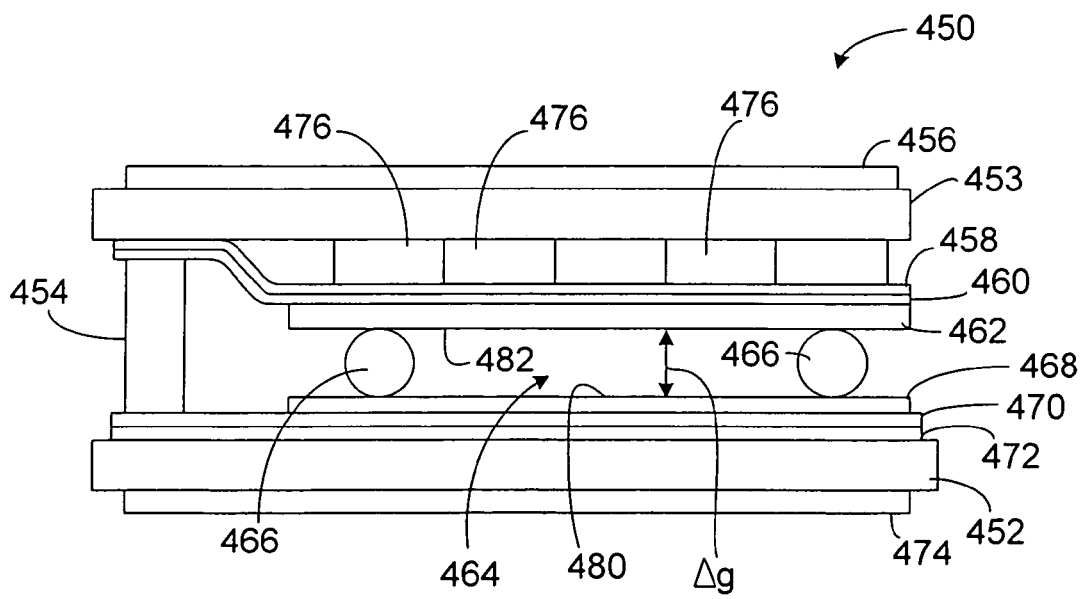
FIG. 14 is a portion of an exemplary liquid crystal display.

Referring to FIG. 14, a passive matrix LCD 450 is composed of several layers. The main parts are two glass plates 452,453 connected by seals 454. A polarizer 456 is applied to the front glass plate 453 in order to polarize incoming light in a single direction. The polarized light passes through the front glass plate 453. An Indium Tin Oxide (ITO) layer 458 is used as an electrode. A passivation layer 460, sometimes called hard coat layer, based on SiOx is coated over the ITO 458 to electrically insulate the surface. Polyimide 462 is printed over the passivation layer 460 to align the liquid crystal fluid 464. The liquid crystal fluid is sensitive to electric fields and changes orientation when an electric field is applied. The liquid crystal is also optically active and rotates the polarization direction of the incoming light. The cell gap $\Delta g$, i.e., thickness of the liquid crystal layer 464, is determined by spacers 466, which keep the two glass plates 452,453 at a fixed distance. When there is no electric potential from the front plate 453 to the rear plate 452, the polarized light is rotated 90° as it passes through the liquid crystal layer 464. When an electric potential is applied from one plate to the other plate the light is not rotated. After the light has passed through the liquid crystal layer 464, it passes through another polyimide layer 468, another hard coat layer 470, a rear ITO electrode 472, and the rear glass plate 452. Upon reaching a rear polarizer 474, the light either transmitted through or absorbed, depending on whether or not it has been rotated 90°. The cell 450 may include filters 476 or other colorizing elements to provide a color display.

The cell gap $\Delta g$ determines to a great extent the optoelectrical properties of the LCD, e.g., the contrast ratio and brightness. Cell gap control during manufacturing is critical to obtaining uniform, quality displays. The actual cell gap may differ from the dimensions of spacers 466 because, during assembly, pressure or vacuum is applied to introduce the liquid crystal medium, seals 454 cure and may change dimensions, and the added liquid crystal medium generates capillary forces between plates 452,453. Both before and after adding the liquid crystal medium 464, surfaces 480,482 of plates 452,453 reflect light that results in an interference pattern indicative of the cell gap $\Delta g$. The low coherence nature of the interference signal either itself or in combination with the described interference signal processing techniques can be used to monitor properties of the cell including the cell gap $\Delta g$ during manufacture even in the presence of interfaces formed by other layers of the cell.

An exemplary method can include obtaining a low coherence interference signal including interference patterns indicative of the cell gap $\Delta g$ prior to adding layer 464. The cell gap (or other spatial property of the cell) is determined from the interference patterns and can be compared to a specified value. Manufacturing conditions, e.g., a pressure or vacuum applied to plates 452,453 can be changed to modify the cell gap $\Delta g$ if a difference between the specified value and the determined cell gap exceeds tolerances. This process can be repeated until achieving the desired cell gap. Liquid crystal medium is then introduced into the cell. The amount of liquid crystal medium to be added can be determined from the measured spatial property of the cell. This can avoid over- or underfilling the cell. The filling process can also be monitored by observing interference signals from the surfaces 480,482. Once the cell has been filed, additional low coherence interference patterns are obtained to monitor the cell gap $\Delta g$ (or other spatial property). Again, the manufacturing conditions can be changed so that the cell gap is maintained or brought within tolerances.

LASER SCRIBING AND CUTTING

Lasers can be used to scribe objects in preparation for separating different, concurrently manufactured structures, e.g., microelectronics structures. The quality of separation is related to the scribing conditions, e.g., laser focus size, laser power, translation rate of the object, and scribe depth. Because the density of features of the structure may be large, the scribe lines may be adjacent thin film or layers of the structures. Interfaces associated with the thin film or layers may create interference patterns that appear when interferometry is used to determine the scribe depth. The methods and systems described herein can be used to determine the scribe depth even in the presence of such adjacent films or layers.

An exemplary method can include scribing one or more electronic structures and separating the structures along the scribe lines. Before and/or after separation, low coherence interference signals can be used to determine the depth of scribe. Other scribing conditions are known, e.g., laser spot size, laser power, translation rate. The scribe depth can be determined from the interference signals. The quality of separation as a function of the scribing conditions, including the scribe, depth, can be determined by evaluating the separated structures. Based on such determinations, the scribing conditions necessary to achieve a desired separation quality can be determined. During continued manufacturing, low coherence interference signals can be obtained from scribed regions to monitor the process. Scribing conditions can be changed to maintain or bring the scribe properties within tolerances.

Other aspects, features, and embodiments are within the scope of the following claims.

What is claimed is:
1. An optical system, comprising:
a photolithography system configured to illuminate a portion of an object with a light pattern, the photolithography system comprising a reference surface;
a low coherence interferometer having a reference optical path and a measurement optical path, light that passes along the reference optical path reflecting at least once from the reference surface and light that passes along the measurement optical path reflecting at least once from the object; and a detector configured to detect a low coherence interference signal comprising light that has passed along the reference optical path and light that has passed along the measurement optical path, the low coherence interference signal being indicative of a spatial relationship between the reference surface and the object.

2. The optical system of claim 1, wherein the photolithography system includes an illumination optic having an illumination optic surface, light of the light pattern traveling along an optical path that includes the illumination optic surface, wherein the illumination optic surface and the reference surface are at least partially coextensive.

3. The optical system of claim 1, wherein the light that passes along the measurement optical path reflects at least once from the portion of the object to be illuminated by the photolithography system.

4. The optical system of claim 1, wherein the light of the low coherence interference signal that has passed along the reference optical path and the light of the low coherence interference signal that has passed along the measurement optical path have a range of optical path length differences, the range being at least 20% of a coherence length of the low coherence interferometer.

5. The optical system of claim 4, wherein the range is at least as great as the coherence length of the low coherence interferometer.

6. The optical system of claim 1, wherein the detector comprises a plurality of detector elements each configured to detect a respective low coherence interference signal, each low coherence interference signal comprising light that has passed along a respective different portion of the reference optical path and light that has passed along a respective different portion of the measurement optical path, each low coherence interference signal being indicative of a spatial relationship between a different point of the object and the reference surface.

7. The optical system of claim 6, comprising:
a processor configured to:
determine the spatial relationship between each of the different points of the object and the reference surface based on at least a respective one of the low coherence interference signals.

8. The optical system of claim 7, comprising a translation stage for manipulating a relative position and orientation between the object and the photolithography system and wherein the processor is configured to:
modify a relative position of the object and the photolithography system based on the spatial relationships.

9. The optical system of claim 6, wherein the light of each low coherence interference signal that has passed along the respective different portion of the reference optical path and the light of the low coherence interference signal that has passed along the respective different portion of the measurement optical path have a range of optical path length differences, the range being at least 20% of a coherence length of the low coherence interferometer.

10. A method, comprising:
positioning an object generally along an optical path of a photolithography system;
reflecting a first portion of light from a light source from a reference surface of the photolithography system;
reflecting a second portion of light from the light source from the object; and forming a low coherence interference signal comprising light reflected from the reference surface and light reflected from the object, the low coherence interference signal indicative of a spatial relationship between the object and the photolithography system.

11. The method of claim 10, comprising:
reflecting a respective first portion of light from the light source from each of a plurality of locations of the reference surface of the photolithography system;
reflecting a respective second portion of light from the light source from each of a plurality of locations of the object; and
forming plurality of low coherence interference signals, each comprising light reflected from a respective one of the different locations of the reference surface and light reflected from a respective one of the different locations of the object, each low coherence interference signal being indicative of a spatial relationship between at least one of the different locations of the object and the photolithography system.

12. The method of claim 10, comprising performing the reflecting the first portion of light and the reflecting the second portion of light after positioning the object.

13. The method of claim 10, further comprising changing a relative position of the object and the reference surface based on the spatial relationship.

14. The method of claim 10, wherein the reference surface is a surface of an optic of the photolithography system.

15. The method of claim 14, further comprising using the photolithography system to project an ultraviolet light image onto the object, light forming the ultraviolet image passing along an optical path including the surface of the optic.

16. The method of claim 10, wherein the object includes a substrate and a thin film having an outer surface and the forming comprises combining light reflected from the reference surface and the light reflected from the outer surface of the thin film, and the spatial relationship is between the outer surface of the thin film and the photolithography system.

17. The method of claim 16, wherein the light of the second portion of light from the light is substantially attenuated by the thin film.

18. The method of claim 16, wherein the thin film includes photoresist and the light of the second portion of light from the light source has an energy insufficient to expose the photoresist.

19. The method of claim 10, wherein the object includes a substrate and a thin film having an outer surface and the forming comprises combining light reflected from the reference surface and light reflected from the substrate, and the spatial relationship is between the substrate and the photolithography system.

20. The method of claim 19, wherein the reflecting a second portion of light from the light source from the object comprises irradiating the object at Brewster's angle.

21. The method of claim 10, wherein the forming comprises using an interferometer and the light of the low coherence interference signal that has passed along the reference optical path and the light of the low coherence interference signal that has passed along the measurement optical path have a range of optical path differences, the range being at least 20% of a coherence length of the interferometer.

22. The method of claim 21, wherein the reflecting a second portion of light from the object comprises directing irradiating the object at an angle of incidence of at least 50°.

23. A system for determining a spatial property of an object, comprising:
a light source;
an optical system configured to:
illuminate the object at a grazing angle of incidence with a first portion of light from the light source, at least some of the first portion of light reflecting from the object;
illuminate a processing tool with a second portion of light from the light source, at lease some of the second portion of light reflecting from a surface of the processing tool;
vary the optical path difference between the light reflected from the object and light reflected from the surface of the processing tool,
combined, over a range of optical path differences, light reflected from the object and light reflected from the surface of the processing tool; and
a detector configured to detect the light combined over the range of optical path differences as a plurality of interference fringes each having a peak amplitude, the range of optical path differences being sufficient to modulate the peak amplitudes of the interference fringes.

24. The system of claim 23, wherein the range of optical path differences is at least as great as a coherence length of the optical system.

25. The system of claim 23, comprising a processor, the processor is configured to:
determine a spatial property of the object based on the plurality of interference fringes.

26. The system of claim 23, wherein:
the optical system is configured to:
illuminate each of a plurality of points of the object at a grazing angle of incidence with a respective first portion of light from the light source, at least some of each respective first portion of light reflecting from the object as a respective portion of reflected light;
combine each portion of reflected light with a corresponding second portion of light derived from the same light source to prepare respective combined light; and
the detector comprises:
a plurality of detector elements, each configured to detect a respective plurality of interference fringes, each respective plurality of interference fringes comprising contributions from a respective combined light, the combined light of the each plurality of interference fringes having a range of optical path length differences, each range of optical path length differences being sufficient to modulate the peak amplitudes of the corresponding interference fringes.

27. The system of claim 26, comprising a processor, the processor is configured to:
determine a spatial property of each of the points based on the respective plurality of interference fringes.

28. The system of claim 25, wherein the object comprises a substrate and an overlying thin film, the thin film having an outer surface, and wherein the spatial property is a spatial property of the outer surface of the thin film.

29. The system of claim 28, wherein the processor is in communication with a translation stage configured to change a relative position between the object and a reference, and wherein the processor is configured to change the relative position based on the spatial property.

30. A method, comprising:
illuminating an object a grazing angle of incidence with a first portion of light from a light source, at least some of the illuminating light reflecting from the object;
illuminating a surface of a processing tool with light from a light source, at least some of the illuminating light reflecting from the processing tool;
providing a range of optical path differences between the light reflected from the object and the portion of light derived from the light source;
combining, over the range of optical path differences, light reflected from the object and light reflected from the surface of the processing tool;
detecting the light combined over a range of optical path differences as a plurality of interference fringes each have a peak amplitude, the range of optical path differences being sufficient to modulate the peak amplitudes of the interference fringes.

31. The method of claim 30, wherein the combining comprises using an interferometer having a coherence length, the range of optical path differences being at least as great as the coherence length.

32. The method of claim 31, wherein the detecting comprises detecting at least a portion of an interference pattern comprising the interference fringes and the method comprises determining a spatial property of the object based on the at least a portion of an interference pattern, and outputting information related to the spatial property.

33. The method of claim 32, wherein the object comprises a substrate comprising an overlying layer of photoresist having an outer surface and the spatial property is a spatial property of the outer surface, and the processing tool comprises a photolithography system.

34. The method of claim 33, comprising changing a relative position between the photolithography system and the object based on the spatial property of the outer surface.

35. The method of claim 32, wherein the object comprises a portion of a liquid crystal display.

36. The method of claim 32, further comprising scribing the object and wherein the processing tool comprises a scribing system and the spatial property is a spatial property of a first scribed line formed by the scribing.

37. The method of claim 36, comprising further scribing the object or another object and changing a parameter of the further scribing based on the spatial property of the first scribed line.

38. The method of claim 32, wherein the processing tool comprises a solder bump manufacturing tool and the object comprises a structure during solder bump manufacturing.

39. The method of claim 38, wherein the spatial property is a spatial property of a portion of the object non-wettable by solder.

40. An apparatus, comprising:
a photolithography system configured to illuminate a portion of an object with a light pattern, the photolithography system comprising a reference surface;
a plurality of detector elements;
an optical system operable as an interferometer and as a triangulation system, the interferometer having a reference optical path and a measurement optical path, light that passes along the reference optical path reflecting at least once from the reference surface and light that passes along the measurement optical path reflecting at least once from the object, wherein the plurality of detector elements are configured to detect an interference signal comprising light that has passed along the reference optical path and light that has passed along the measurement optical path, the interference signal being indicative of a spatial relationship between the reference surface and the object; and the triangulation system is configured to determine a spatial relationship between the object and the reference surface based on a spatial relationship between an image of the object and an image of the reference surface.

41. An apparatus, comprising:
a photolithography system configured to illuminate a portion of an object with a light pattern, the photolithography system comprising a reference surface;
a plurality of detector elements;
an optical system configured to illuminate a portion of the object with first light, illuminate the reference surface with second light, and form an image of the first light and an image of the second light on the detector; and
a processor configured to determine a spatial relationship between the object and the reference surface based on a spatial relationship between the image of the first light and the image of the second light.

42. The apparatus of claim 41, wherein the processor is configured to determine the spatial relationship between the image of the first light and the image of the second light as a function of the detector elements.

43. The apparatus of claim 41, comprising a positioner configured to modify a relative position between the object and the reference surface, wherein the processor is configured to operate the positioner based on the spatial relationship between the object and the reference surface.

44. The apparatus of claim 41, wherein the portion of the object illuminated with light is a portion of the object to be illuminated by the photolithography system.

45. The apparatus of claim 44, wherein the photolithography system includes an optic having a surface at least partially coextensive with the reference surface.

46. The apparatus of claim 45, wherein the optical system comprises:
an interferometer having a reference optical path and a measurement optical path, light that passes along the reference optical path reflecting at least once from the reference surface and light that passes along the measurement optical path reflecting at least once from the object; and
wherein the plurality of detector elements are configured to detect an interference signal comprising light that has passed along the reference optical path and light that has passed along the measurement optical path, the interference signal being indicative of a spatial relationship between the reference surface and the object.

* * * * *